(12) United States Patent
Malhan et al.

(10) Patent No.: US 8,274,086 B2
(45) Date of Patent: Sep. 25, 2012

(54) WIDE BAND GAP SEMICONDUCTOR DEVICE INCLUDING JUNCTION FIELD EFFECT TRANSISTOR

(75) Inventors: Rajesh Kumar Malhan, Nagoya (JP); Yuuichi Takeuchi, Obu (JP); Jeremy Rashid, Isleham (GB)

(73) Assignees: DENSO CORPORATION, Kariya (JP); University of Cambridge, Cambridge (GB)

( * ) Notice: Subject to any disclaimer, the term of this patent is extended or adjusted under 35 U.S.C. 154(b) by 525 days.

(21) Appl. No.: 12/458,968

(22) Filed: Jul. 28, 2009

(65) Prior Publication Data
US 2010/0025693 A1 Feb. 4, 2010

(30) Foreign Application Priority Data
Jul. 30, 2008 (JP) ................................. 2008-196107

(51) Int. Cl.
*H01L 29/15* (2006.01)
*H01L 31/0256* (2006.01)
(52) U.S. Cl. ............ 257/76; 257/E29.242; 257/E29.002
(58) Field of Classification Search .................... 257/76, 257/E29.002, E29.242
See application file for complete search history.

(56) References Cited

U.S. PATENT DOCUMENTS
2004/0212011 A1 10/2004 Ryu
2004/0212022 A1 10/2004 Inoue
2006/0011924 A1 1/2006 Mazzola et al.

FOREIGN PATENT DOCUMENTS
JP A-2003-68760 3/2003

OTHER PUBLICATIONS
Ludikhuize, A. W. "A Review of RESURF Technology", ISPSD '2000: the 12th International Symposium on Power Semiconductor Devices and ICs; May 22-25, 2000; IEEE 2000; p. 11.*

* cited by examiner

*Primary Examiner* — Stephen W Smoot
*Assistant Examiner* — Vicki B Booker
(74) *Attorney, Agent, or Firm* — Posz Law Group, PLC

(57) ABSTRACT

A wide band gap semiconductor device has a transistor cell region, a diode forming region, an electric field relaxation region located between the transistor cell region and the diode forming region, and an outer peripheral region surrounding the transistor cell region and the diode forming region. In the transistor cell region, a junction field effect transistor is disposed. In the diode forming region, a diode is disposed. In the electric field relaxation region, an isolating part is provided. The isolating part includes a trench dividing the transistor cell region and the diode forming region, a first conductivity-type layer disposed on an inner wall of the trench, and a second conductivity-type layer disposed on a surface of the first conductivity-type layer so as to fill the trench. The first conductivity-type layer and the second conductivity-type layer provide a PN junction.

13 Claims, 23 Drawing Sheets

WIDE BAND GAP SEMICONDUCTOR DEVICE INCLUDING JUNCTION FIELD EFFECT TRANSISTOR

CROSS REFERENCE TO RELATED APPLICATIONS

The present application is based on and claims priority to Japanese Patent Application No. 2008-196107 filed on Jul. 30, 2008, the contents of which are incorporated in their entirety herein by reference.

BACKGROUND OF THE INVENTION

1. Field of the Invention

The present invention relates to a wide band gap semiconductor device including a junction filed effect transistor (JFET).

2. Description of the Related Art

US 2006/0011924 A discloses a semiconductor device including a transistor cell region in which a JFET is disposed and an outer peripheral region in which a schottky diode and an outer peripheral withstand-voltage part are disposed. In the above-described semiconductor device, a trench is provided between the transistor cell region and the outer peripheral region and the trench is filled with an oxide layer, and thereby the transistor cell region and the outer peripheral region are isolated from each other.

When a semiconductor device has an isolation structure including a trench filled with an oxide layer, a breakdown may occur at an end portion of a schottky diode, and the oxide layer may breakdown. Especially, when the above-described isolation structure is applied to a silicon carbide (SiC) semiconductor device, electric field strength applied to an oxide layer is about three times greater than silicon (Si). Thus, the oxide layer may breakdown easily. In addition, a breakdown voltage of the semiconductor device depends on a breakdown voltage of the isolation structure including the trench filled with the oxide layer. Thus, even if a breakdown voltage of the JFET and a breakdown voltage of the schottky diode are increased, the breakdown voltage of the semiconductor device is difficult to be improved.

JP-A-2003-68760 discloses an SiC semiconductor device including a transistor cell region in which a JFET is disposed and an outer peripheral region in which a schottky barrier diode (JBS) is disposed. The JFET in the SiC semiconductor device includes an N− type drift layer. On the N− type drift layer, a P+ type first gate layer and an N+ type source region are disposed. The JFET has a trench penetrating the P+ type first gate layer and the N+ type source region to the N− type drift layer. In the trench, an N− type channel layer and a P+ type second gate region are disposed. In the JBS, the P+ type first gate layer is removed by etching so that the N− type drift layer is exposed. In the exposed N− drift layer, a P+ type impurity region is disposed. In addition, a schottky electrode being in contact with the P+ type impurity region and the N− type drift layer is disposed. In order to isolate the transistor cell region and the outer peripheral region, an oxide layer is disposed at a stepped portion of the P+ type first gate layer and the N+ type source region, that is, a portion from which the P+ type first gate layer and the N+ type source region are removed.

Even in a case where the stepped portion of the P+ type first gate layer and the N+ type source region are covered with the oxide layer for isolating the transistor cell region and the outer peripheral region, a breakdown may occur at an end portion of the JBS and the oxide layer may breakdown. A breakdown voltage of the semiconductor device depends on a breakdown voltage of the isolation structure. Thus, even if a breakdown voltage of the JFET and a breakdown voltage of the schottky diode are increased, the breakdown voltage of the semiconductor device is difficult to be improved.

US 2004/0212011 A discloses a semiconductor device including a metal-oxide semiconductor field-effect transistor (MOSFET) and a JBS. In the semiconductor device, the MOSFET surrounds the JBS. A P+ type body layer for electrically coupling a P type channel region (base region) with a source electrode in the MOSFET also functions as a P+ type impurity region of the JBS. In such a case, the MOSFET and the JBS are combined. Thus, an isolation is not required.

However, when the MOSFET and the JBS are combined, the P+ type body layer is required to have an ohmic contact with the source electrode. An impurity concentration of each portion may be set appropriately for the MOSFET and may be not appropriate for a diode. Thus, when electric current flows in the JBS, most of the electric current flows toward the P+ type body layer and little of the electric current flows toward the P+ type layer. Therefore, the electric current locally flows and a breakdown voltage of the semiconductor device is difficult to be improved.

In the above-described conventional art, SiC is taken as an exampled of a wide band gap semiconductor. However, the above-described issue may also occur in a semiconductor device including another wide gap semiconductor such as gallium nitride (GaN) and diamond.

SUMMARY OF THE INVENTION

In view of the foregoing problems, it is an object of the present invention to provide a wide band gap semiconductor device that can have a high breakdown voltage between a transistor cell region and a diode forming region.

A wide band gap semiconductor device according to an aspect of the present invention includes a semiconductor substrate having a transistor cell region, a diode forming region, an electric field relaxation region located between the transistor cell region and the diode forming region, and an outer peripheral region surrounding the transistor cell region, diode forming region, and the electric field relaxation region. The semiconductor substrate in the transistor cell region includes a substrate, a first semiconductor layer disposed on the substrate, a second semiconductor layer disposed on the first semiconductor layer, and a third semiconductor layer disposed on the second semiconductor layer. The substrate is made of a wide band gap semiconductor of a first conductivity type. The first semiconductor layer is made of a wide band gap semiconductor of the first conductivity type and has an impurity concentration lower than an impurity concentration of the substrate. The second semiconductor layer is made of a wide band gap semiconductor of a second conductivity type. The third semiconductor layer is made of a wide band gap semiconductor of the first conductivity type and has an impurity concentration higher than the impurity concentration of the first semiconductor layer. The semiconductor substrate in the electric field relaxation region includes the substrate, the first semiconductor layer disposed on the substrate, and the second semiconductor layer disposed on the first semiconductor layer. In the transistor cell region, a JFET is disposed. The JFET includes a first trench penetrating the third semiconductor layer and the second semiconductor layer to the first semiconductor layer, a first gate region provided by the second semiconductor layer located on a side surface of the first trench, a source region provided by the third semiconductor layer located on the side surface of the first trench, a channel layer disposed on an inner wall of the first trench and made of a wide band gap semiconductor of the first conductivity type, a second gate region disposed on a surface of the channel layer so as to fill the first trench and made of a wide band gap semiconductor of the second conductivity type, a source electrode electrically coupled with the source region, and a drain electrode electrically coupled with the substrate. In the diode forming region, a diode is disposed. The diode includes a first-surface electrode and a second-surface electrode. The second-surface electrode is provided by the drain electrode and operates as an anode. The first-surface electrode is disposed on an opposite side of the semiconductor substrate from the second-surface electrode and operates as a cathode. In the outer peripheral region, an outer peripheral withstand-voltage part is disposed. In the electric field relaxation region, an isolating part is disposed. The isolating part includes a second trench penetrating the second semiconductor layer to the first semiconductor layer so as to divide the transistor cell region and the diode forming region, a first conductivity-type layer disposed on an inner wall of the second trench and made of a wide band gap semiconductor of the first conductivity type, and a second conductivity-type layer disposed on a surface of the first conductivity-type layer so as to fill the second trench and made of a wide gap semiconductor of the second conductivity type. The first conductivity-type layer and the second conductivity-type layer provide a PN junction.

In the above-described wide band gap semiconductor device, the transistor cell region and the diode forming region are isolated by the PN junction. Thus, the above-described wide band gap semiconductor device can have a high breakdown voltage between the transistor cell region and the diode forming region.

A wide band gap semiconductor device according to another aspect of the present invention includes a semiconductor substrate having a transistor cell region, a diode forming region, an electric field relaxation region located between the transistor cell region and the diode forming region, and an outer peripheral region surrounding the transistor cell region, diode forming region, and the electric field relaxation region. The semiconductor substrate in the transistor cell region includes a substrate, a first semiconductor layer disposed on the substrate, a second semiconductor layer disposed on the first semiconductor layer, and a third semiconductor layer disposed on the second semiconductor layer. The substrate is made of a wide band gap semiconductor of a first conductivity type. The first semiconductor layer is made of a wide band gap semiconductor of the first conductivity type and has an impurity concentration lower than an impurity concentration of the substrate. The second semiconductor layer is made of a wide band gap semiconductor of a second conductivity type. The third semiconductor layer is made of a wide band gap semiconductor of the first conductivity type and has an impurity concentration higher than the impurity concentration of the first semiconductor layer. The semiconductor substrate in the electric field relaxation region includes the substrate, the first semiconductor layer disposed on the substrate, and the second semiconductor layer disposed on the first semiconductor layer. In the transistor cell region, a JFET is disposed. The JFET includes a first trench penetrating the third semiconductor layer and the second semiconductor layer to the first semiconductor layer, a first gate region provided by the second semiconductor layer located on a side surface of the first trench, a source region provided by the third semiconductor layer located on the side surface of the first trench, a channel layer disposed on an inner wall of the first trench and made of a wide band gap semiconductor of the first conductivity type, a second gate region disposed on a surface of the channel layer so as to fill the first trench and made of a wide band gap semiconductor of the second conductivity type, a source electrode electrically coupled with the source region, and a drain electrode electrically coupled with the substrate. In the diode forming region, a diode is disposed. The diode includes a first-surface electrode and a second-surface electrode. The second-surface electrode is provided by the drain electrode and operates as an anode. The first-surface electrode is disposed on an opposite side of the semiconductor substrate from the second-surface electrode and operates as a cathode. In the outer peripheral region, an outer peripheral withstand-voltage part is disposed. In the electric field relaxation region, an isolating part is disposed. The isolating part includes a second trench penetrating the second semiconductor layer to the first semiconductor layer so as to divide the transistor cell region and the diode forming region and a first conductivity-type layer filling the second trench and made of a wide band gap semiconductor of the first conductivity type. The first conductivity-type layer and the second semiconductor layer located on a side surface of the second trench provide a PN junction.

In the above-described wide band gap semiconductor device, the transistor cell region and the diode forming region are isolated by the PN junction. Thus, the above-described wide band gap semiconductor device can have a high breakdown voltage between the transistor cell region and the diode forming region.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

First Embodiment

Figure 1:
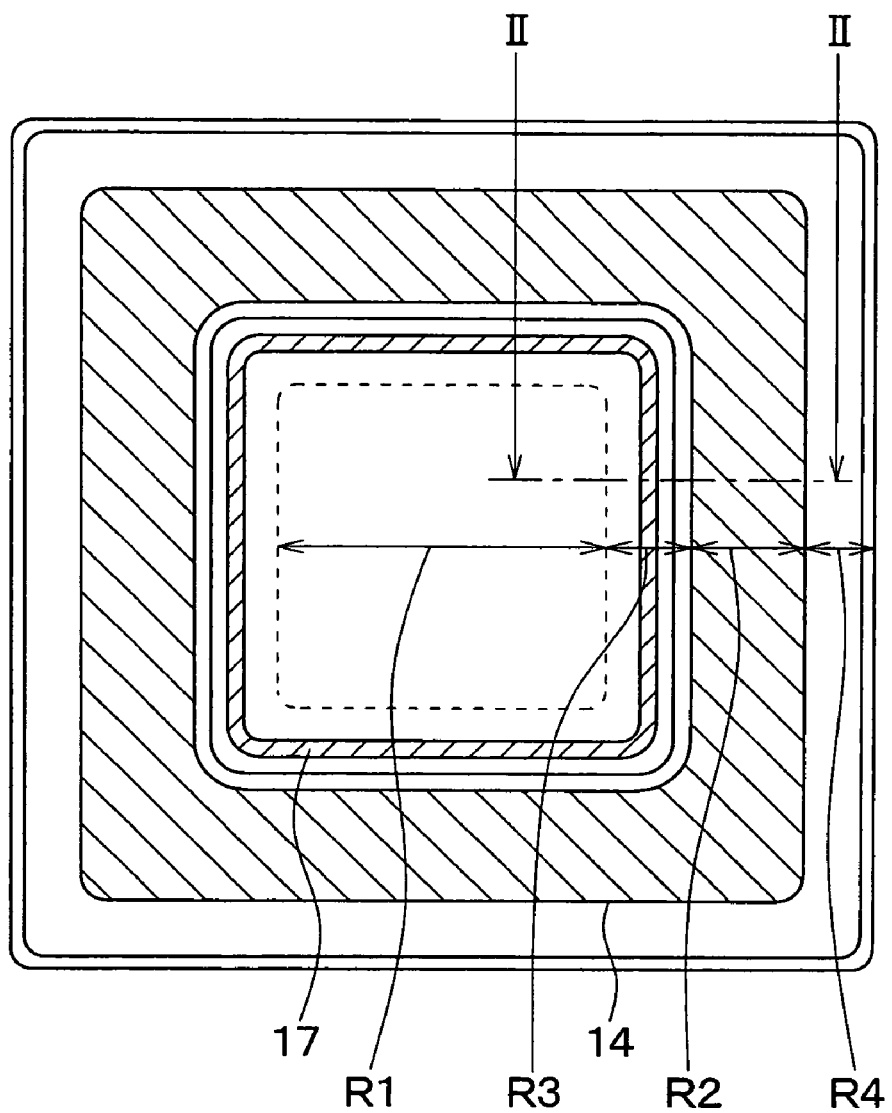
FIG. 1 is a diagram illustrating a top view of an SiC semiconductor device according to a first embodiment of the present invention.

An SiC semiconductor device according to a first embodiment of the present invention will be described with reference to FIG. 1 and FIG. 2.

The SiC semiconductor device includes a transistor cell region R1, a diode forming region R2, an electric field relaxation region R3, and an outer peripheral region R4. At the transistor cell region R1, a plurality of JFETs is formed. The transistor cell region R1 has an approximately square shape with rounded corners in top view. At the diode forming region R2, a JBS is formed as a diode. The diode forming region R2 has an approximately square frame shape with rounded corners in top view and surrounds the transistor cell region R1. The electric field relaxation region R3 is located between the transistor cell region R1 and the diode forming region R2. The electric field relaxation region R3 has an approximately square frame shape with rounded corners in top view and surrounds the transistor cell region R1. The electric field relaxation region R3 isolates the transistor cell region R1 and the diode forming region R2. At the electric field relaxation region R3, an electric field concentration is relaxed. The outer peripheral region R4 has an approximately square frame shape with rounded corners in top view and surrounds a periphery of the diode forming region R2. The outer peripheral region R4 expands an electric field extending from the transistor cell region R1 and the diode forming region R2 and terminates the electric field at an outer peripheral side of the SiC semiconductor device. Thus, the SiC semiconductor device can have a high breakdown voltage.

Figure 2:
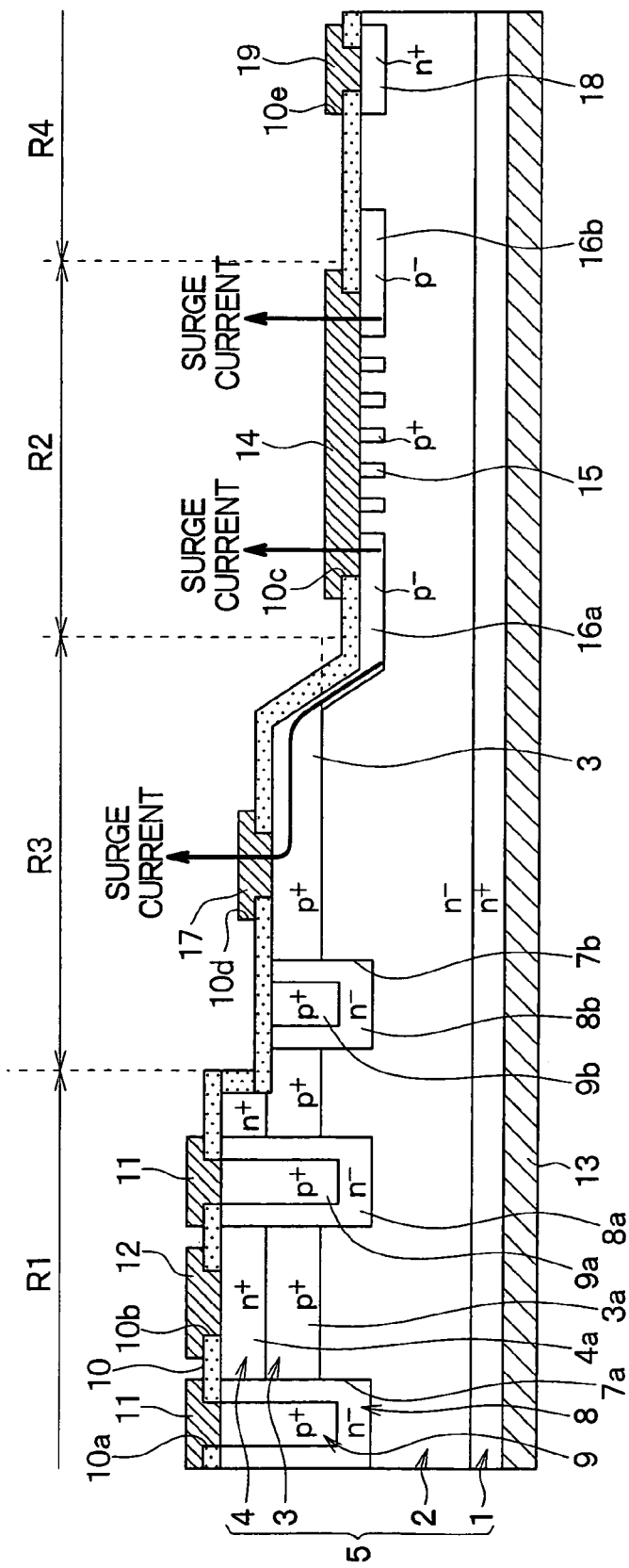
FIG. 2 is a diagram illustrating a cross-sectional view of the SiC semiconductor device taken along line II-II in FIG. 1.

As illustrated in FIG. 2, the SiC semiconductor device includes an N+ type substrate 1 having an impurity concentration greater than or equal to about $1 \times 10^{19}$ cm$^{-3}$, for example. On the N+ type substrate 1, an N− type drift layer 2 is disposed. The N− type drift layer 2 has an impurity concentration lower than the impurity concentration of the N+ type substrate 1. The N− type drift layer 2 has an impurity concentration of from about $1 \times 10^{15}$ cm$^{-3}$ to about $5 \times 10^{16}$ cm$^{-3}$, for example. On the N− type drift layer 2, a P+ type layer 3 is disposed. The P+ type layer 3 has an impurity concentration of from about $1 \times 10^{18}$ cm$^{-3}$ to about $5 \times 10^{19}$ cm$^{-3}$, for example. On the P+ type layer 3, an N+ type layer 4 is disposed. The N+ type layer 4 has an impurity concentration higher than the impurity concentration of the N− type drift layer 2. The N+ type layer 4 has an impurity concentration of from about $1 \times 10^{18}$ cm$^{-3}$ to about $5 \times 10^{20}$ cm$^{-3}$ for example. Each of the N+ type substrate 1, the N− type drift layer 2, the P+ type layer 3, and the N+ type layer 4 is made of SiC, for example. The N+ type substrate 1, the N− type drift layer 2, the P+ type layer 3, and the N+ type layer 4 configurates a semiconductor substrate 5. As illustrated in FIG. 1, the transistor cell region R1 is located at a center portion of the semiconductor substrate 5. Around the transistor cell region R1, the electric field relaxation region R3, the diode forming region R2, and the outer peripheral region R4 are arranged in this order.

As illustrated in FIG. 2, in the transistor cell region R1 of the semiconductor substrate 5, trenches 7a penetrating the N+ type layer 4 and the P+ type layer 3 to the N− type drift layer 2 are provided from a front-surface side. On a surface of each of the trenches 7a, an N− type layer 8 is disposed. The N− type layer 8 has a thickness of from about 0.1 μm to about 0.5 μm, for example. The N− type layer 8 has an impurity concentration of from about $1 \times 10^{16}$ cm$^{-3}$ to about $1 \times 10^{18}$ cm$^{-3}$, for example. On the N− type layer 8, a P+ type layer 9 is disposed so as to fill the trench 7a. The P+ type layer 9 has an impurity concentration of from about $1 \times 10^{18}$ cm$^{-3}$ to about $5 \times 10^{20}$ cm$^{-3}$, for example. The P+ type layer 3 provides a first gate region 3a, the P+ type layer 9 provides a second gate region 9a, the N+ type layer 4 provides an N+ type source region 4a, and the N− type layer 8 provides an N− type channel layer 8a.

The impurity concentration of each of the N− type channel layer 8a, the first gate region 3a, and the second gate region 9a and the thickness of the N− type channel layer 8a are set based on an operating state of the JFETs. In the present embodiment, the impurity concentrations and the thickness are set so that the JFETs are operated in a normally-off mode.

On surfaces of the N+ type layer 4, the N− type layer 8, and the P+ type layer 9, a gate electrode 11 and a source electrode 12 are disposed through an interlayer insulating layer 10. The gate electrode 11 is electrically coupled with the second gate region 9a through a contact hole 10a provided at the interlayer insulating layer 10. In addition, the gate electrode 11 is electrically coupled with the first gate region 3a on a cross-section different from a cross-section illustrated in FIG. 2. The source electrode 12 is electrically coupled with the N+ type source region 4a through a contact hole 10b provided at the interlayer insulating layer 10. The gate electrode 11 is made of aluminum, which can form an ohmic contact with the P+ type layer, and nickel stacked on aluminum, for example. The source electrode 12 is made of nickel, for example.

On a rear surface of the semiconductor substrate 5, a drain electrode 13 is disposed. The drain electrode 13 is electrically coupled with the whole rear surface of the N+ type substrate 1. The JFET has the above-described configuration and a plurality of the JFETs is formed in the transistor cell region R1.

In the diode forming region R2, the P+ type layer 3 and the N+ type layer 4 in the semiconductor substrate 5 is removed by etching. Thus, a portion of the diode forming region R2 at a boundary with the electric field relaxation region R3 is uneven and the N− type drift layer 2 is exposed.

In the diode forming region R2, a front-surface electrode 14 is in contact with a front-surface side of the N− type drift layer 2 through windows portions 10c provided at the interlayer insulating layer 10. The front-surface electrode 14 can operate as a cathode. At a region where the front-surface electrode 14 is disposed, a plurality of P+ type layers 15 is disposed at a surface portion of the N− type drift layer 2 in a stripe shape or a dotted shape. An inner peripheral end portion of the front-surface electrode 14 is in contact with a P− type reduced surface field (RESURF) layer 16a. An outer peripheral end portion of the front-surface electrode 14 is in contact with a P− type RESURF layer 16b. The front-surface electrode 14 forms a schottky contact with the N− type drift layer 2. The P+ type layers 15 and the P− type RESURF layers 16a and 16b are in floating state. The drain electrode 13 provides a rear-surface electrode that can operate an anode. The JBS can operate as a rectifier element in which a part of a schottky barrier diode is a PN diode. The front-surface electrode 14 is electrically coupled with the source electrode 12 and is in the ground state.

In the electric field relaxation region R3, the N+ type layer 4 in the semiconductor substrate 5 is removed by etching. Thus, a portion of the electric field relaxation region R3 located at a boundary with the transistor cell region R1 is uneven and the P+ type layer 3 is exposed.

In the electric field relaxation region R3, an isolating part is disposed. At a portion of the electric field relaxation region R3 close to the transistor cell region R1, a trench 7b is provided. The trench 7b penetrates the electric field relaxation region R3 to the N− type drift layer 2. The trench 7b surrounds the transistor cell region R1 and divides the transistor cell region R1 and the diode forming region R2. The N− type layer 8 and the P+ type layer 9 are disposed in the trench 7b so as to fill the trench 7b. The N− type layer 8 and the P+ type layer 9 in the electric field relaxation region R3 provides an N type region 8b and a P type region 9b, respectively. In an example illustrated in FIG. 2, the isolating part includes only one trench 7b, that is, only one PN junction. Alternatively, the isolating part may include a plurality of PN junctions and a plurality of trenches 7b may be arranged concentrically so as to surround the transistor cell region R1.

The P− type RESURF layer 16a extends from the diode forming region R2 to a stepped portion of the electric field relaxation region R3 located at a boundary section between the diode forming region R2 and the electric field relaxation region R3. The P− type RESURF layer 16a has an impurity concentration of from about $1 \times 10^{17}$ to about $5 \times 10^{17}$ cm$^{-3}$, for example. In the present embodiment, the stepped portion has a mesa shape and is inclined. The P− type RESURF layer 16a extends the whole area of the stepped portion, and the P− type RESURF layer 16a is connected with the P+ type layer 3. At an outside of the trench 7b, a surge drawing electrode 17 is disposed. When a plurality of the trenches 7b is provided, the surge drawing electrode 17 is located at an outside of an outermost trench 7b. The surge drawing electrode 17 is in contact with a surface of the P+ type layer 3 through a contact hole 10d provided at the interlayer insulating layer 10.

In the outer peripheral region R4, the P+ type layer 3 and the N+ type layer 4 in the semiconductor substrate 5 are removed by etching in a manner similar to the diode forming region R2. Thus, in the outer peripheral region R4, the N− type drift layer 2 is exposed. At a surface portion of the N− type drift layer 2, the P− type RESURF layer 16b extends toward the outer periphery of the transistor cell region R1. The P− type RESURF layer 16b has an impurity concentration of from about $1 \times 10^{17}$ cm$^{-3}$ to about $5 \times 10^{17}$ cm$^{-3}$, for example. An N+ type layer 18 surrounds an outer periphery of the P− type RESURF layer 16. An equipotential ring (EQR) electrode 19 is electrically coupled with the N+ type layer 18 through a contact hole 10e provided at the interlayer insulating layer 10.

Next, an operation of the JFET formed in the transistor cell region R1 of the above-described SiC semiconductor device will be described.

In the present embodiment, the JFET is operated in the normally-off mode. In a state before the gate voltage is applied to the first gate region 3a and the second gate region 9a, the N− type channel layer 8a is pinched off due to a depletion layer expanding from the first gate region 3a and the second gate region 9a toward the N− type channel layer 8a. Thus, a channel region is not provided and electric current does not flow between the source and the drain. When the gate voltage is applied to the first gate region 3a and the second gate region 9a, an expanding amount of the depletion layer expanding from the first gate region 3a and the second gate region 9a toward the N− type channel layer 8a is restricted. Thereby, the channel region is provided and electric current flows between the source and the drain. When the gate voltage applied to the first gate region 3a and the second gate region 9a is stopped and the JFET is deactivated, electric current flows through the JBS that can operate as a rectifier element.

If surge current generates, an avalanche breakdown occurs at the P− type RESURF layers 16a and 16b. Thus, the surge current flows along a passage shown by arrows in FIG. 2. Since the P− type RESURF layer 16 extends to the stepped portion at the boundary section between the electric field relaxation region R3 and the diode forming region R2, the surge current can flow toward the surge drawing electrode 17 in addition to the front-surface electrode 14.

In the SiC semiconductor device according to the present embodiment, the transistor cell region R1 and the diode forming region R2 are isolated by the PN junction of the P type region 9b and the N type region 8b disposed in the electric field relaxation region R3. Thus, a breakdown voltage of the isolating part between the transistor cell region R1 and the diode forming region R2 can be improved compared with a case where an oxide layer is disposed in a trench for isolating because there is no possibility that an oxide layer for isolating breaks down. Thus, the SiC semiconductor can improve the breakdown voltage compared with a case where an oxide layer is used for isolating.

In the present embodiment, the P− type RESURF layer 16a extends to the stepped portion at the boundary section between the electric field relaxation region R3 and the diode forming region R2 so that electric field at the interlayer insulating layer 10 located on the surface of the P− type RESURF layer 16a can be relaxed. Thus, the interlayer insulating layer 10 is restricted from breaking down due to an electric field concentration.

In addition, the surge current can flow to the surge drawing electrode 17 disposed in the electric field relaxation region R3 in addition to the front-surface electrode 14 of the JBS disposed in the diode forming region R2. Thus, the surge current that flows toward the front-surface electrode 14 can be reduced.

Figure 3:
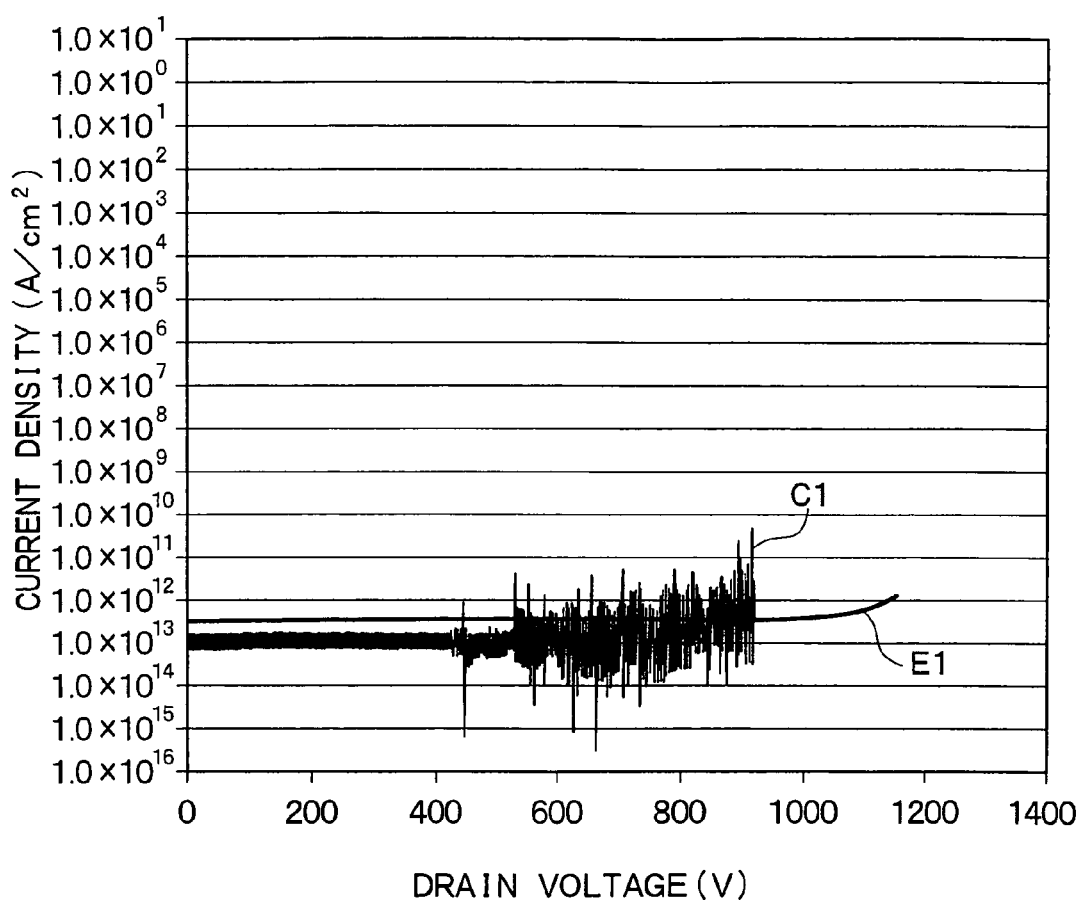
FIG. 3 is a graph illustrating a relationship between a drain voltage and a current density in each of the SiC semiconductor device according to the first embodiment (E1) and an SiC semiconductor device according to a comparative example (C1)
Figure 4:
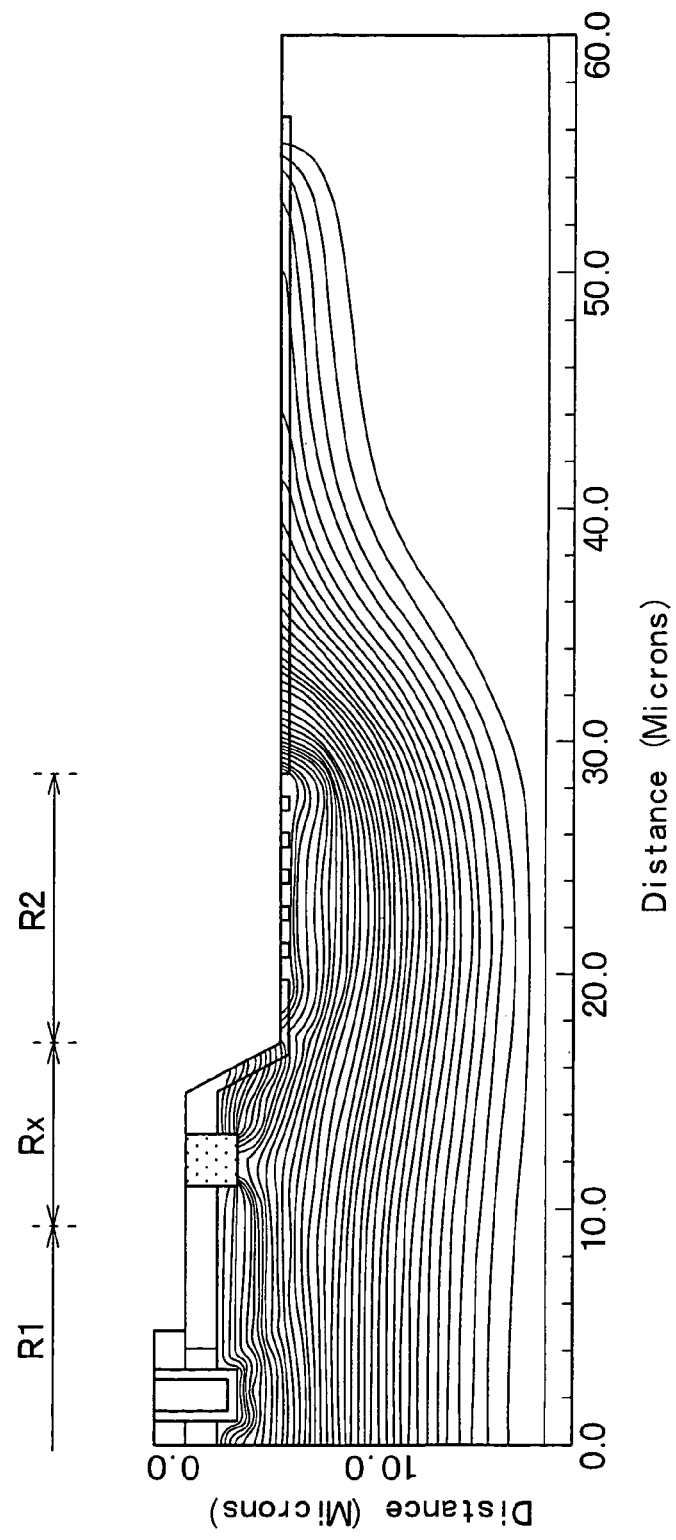
FIG. 4 is a diagraph illustrating an electric field distribution in the SiC semiconductor device according to the comparative example in which a trench filled with an oxide layer is provided for isolating.

A relationship between a drain voltage and a current density of the SiC semiconductor device according to the present embodiment is illustrated in line E1 in FIG. 3. In addition, a relationship between a drain voltage and a current density of an SiC semiconductor device according to a comparative example is illustrated in line C1 in FIG. 3. In the SiC semiconductor device according to the comparative example, a trench is provided at a region Rx between the transistor cell region R1 and the diode forming region R2 and the trench is filled with an oxide layer for isolating the transistor cell region R1 and the diode forming region R2 in a manner similar to the conventional art. As illustrated in FIG. 3, in the SiC semiconductor device according to the comparative example (C1), the drain voltage starts to fluctuate from a low voltage. That is, in the SiC semiconductor device according to the comparative example, a breakdown occurs early and leakage generates. In order to analyze the above-described circumstance, an electric field distribution in the SiC semiconductor device according to the comparative example is simulated, and the simulated result is illustrated in FIG. 4. As illustrated in FIG. 4, an electric field concentration occurs at a corner portion of the trench, and thereby the breakdown occurs early.

In contrast, in the SiC semiconductor device according to the present embodiment (E1) in which the isolating part includes the PN junction, the current density does not fluctuate even when the drain voltage is higher than 1000 V, and a breakdown does not occur.

As a result, the SiC semiconductor device can improve a breakdown voltage at the isolating part between the transistor cell region R1 and the diode forming region R2. Thus, the breakdown voltage of the SiC semiconductor device can be optimally set compared with the case where the isolating part includes the oxide layer.

Next, an exemplary setting method of an area of the transistor cell region R1 and an area of the diode forming region R2 will be described.

A relationship between a voltage and a current density of each of the JFET and the JBS is investigate in a case where a width of the N− type channel layer $8a$ in the JFET, that is, a channel width is about 0.25 µm, the impurity concentration of the N− type channel layer $8a$ is about $4.0 \times 10^{16}$ cm$^{-3}$, and a gate voltage of about 2.5 V is applied to the first gate region $3a$ and the second gate region $9a$. A result of the investigation is illustrated in FIG. 5.

Figure 5:
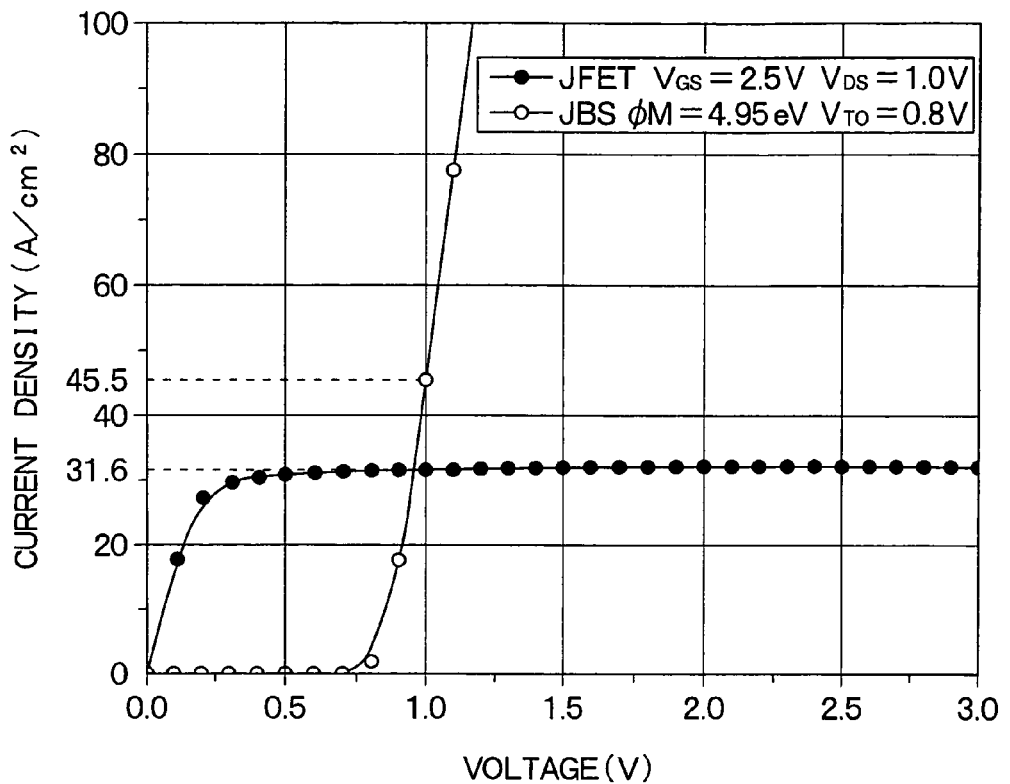
FIG. 5 is a graph illustrating a relationship between a voltage and a current density in each of a JFET and a JBS.

As illustrated in FIG. 5, when a work function $\phi M$ at a contact portion of the front-surface electrode 14 and the N− type drift layer 2 is about 4.95 eV, a schottky barrier $V_{TO}$ is about 0.8 V. The relationship between the voltage (source-drain voltage) and the current density of the JBS is similar to a schottky diode. When the voltage is higher than about 0.8 V, the current density of the JBS drastically increase. The current density of the JFET becomes substantially constant when a depletion layer expanding toward the N− type channel layer $8a$ shrinks and the width of the channel region expands sufficiently.

The area of the JFET and the area of the JBS may be set in such a manner that electric current that flows in the JFET and electric current that flows in the JBS are similar to each other. The JBS can operate as the rectifier element in which electric current flows when the JFET is deactivated. Thus, assuming electric current that flows in the JFET just before the JFET is deactivated flows into the JBS as it is, the area of the JFET and the area of the JBS may be set in such a manner that the electric current that flows in the JFET and the electric current that flows in the JBS are similar to each other. The area of the JFET and the area of the JBS can be set in the following method. In the following description, it is assumed that each of the JFET and the JBS has a circular shape for the sake of convenience.

Figure 6:
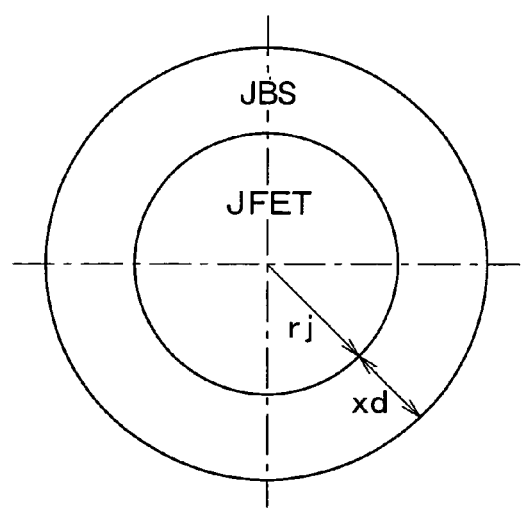
FIG. 6 is a diagram illustrating an exemplary layout of the JFET and the JBS.

If a radius of the JFET is "rj" and a width of the JBS is "xd" as illustrated in FIG. 6, the area "Aj" of the JFET and the area "Ad" of the JBS can be expressed by following formulas (1) and (2).

$$Aj = \pi rj^2 \qquad (1)$$

$$Ad = \pi(rj + xd)^2 - \pi rj^2 \qquad (2)$$

Thus, a ratio P (=Aj/Ad) of the area Aj of the JFET to the area Ad of the JBS can be expressed by following formula (3), and the width "xd" can be expressed by following formula (4).

$$\frac{Aj}{Ad} = P = \frac{rj^2}{(rj + Xd)^2 - rj^2} \qquad (3)$$

$$P(rj + xd)^2 - Prj^2 = rj^2$$

$$(rj + xd)^2 = \left(\frac{1+P}{P}\right)rj^2$$

$$xd = rj\left(\sqrt{\frac{1+P}{P}} - 1\right) \qquad (4)$$

In the JFET, when a target current value is 40 [A], a gate-source voltage $V_{GS}$ is 2.5 [V], and a drain-source voltage $V_{DS}$ is 1 [V], a current density $J_{DS}$ of the drain-source current is found to be 31.6 [A/cm$^2$] from a graph illustrated in FIG. 3. Thus, the area Aj of the JFET can be expressed by following formula (5).

$$Aj = 40 \text{ [A]}/31.6 \text{ [A/cm}^2\text{]} = 1.27 \text{ [cm}^2\text{]} \qquad (5)$$

Because a relationship between the radius "rj" and the area Aj of the JFET is expressed by formula (1), the radius "rj" can be expressed by following formula (6).

$$rj = \sqrt{\frac{Aj}{\pi}} = \sqrt{\frac{1.266 [\text{cm}^2]}{\pi}} = 6.35 [\text{mm}] \qquad (6)$$

In the same condition, that is, in a case where the drain-source voltage $V_{DS}$ is 1 [V], a current density $J_{AK}$ between the anode and the cathode of the JBS is found to be 45.5 [A/cm$^{-3}$]. When a target current value $I_{AK}$ that flows between the anode and the cathode is set to be 12 times greater than a current value $I_{DS}$ of the JFET, that is, $I_{AK}$=12×$I_{DS}$=20 [A], the area Ad can be expressed by following formula (7).

$$Ad = 20 \text{ [A]}/45.5 \text{ [A/cm}^2\text{]} = 0.44 \text{ [cm}^2\text{]} \qquad (7)$$

The ratio P (=Aj/Ad) of the area Aj of the JFET to the area Ad of the JBS can be expressed by formula (3). Thus, the ratio P=Aj/Ad=1.27 [A/cm$^2$]/0.44 [A/cm$^2$]=2.88≅3. By assigning the ratio P to formula (4), the width "xd" of the JBS can be determined as following formula (8).

$$xd = \left(\sqrt{\frac{2.88 + 1}{2.88}} - 1\right) \times 6.35 [\text{mm}] = 1.02 [\text{mm}] \qquad (8)$$

In the above-described way, the area of the JFET in the transistor cell region R1 and the area of the JBS in the diode forming region R2 can be set. When the ratio P is set to be about 3, that is, when the area of the JBS is set to be about ⅓ of the area of the JFET, the electric current that flows in the JBS can be substantially equal to the electric current that flows in the JFET, and thereby the SiC semiconductor device can have a predetermined voltage-current property.

An exemplary manufacturing method of the SiC semiconductor device illustrated in FIG. 1 will be described with reference to FIG. 7 to FIG. 13.

Figure 7:
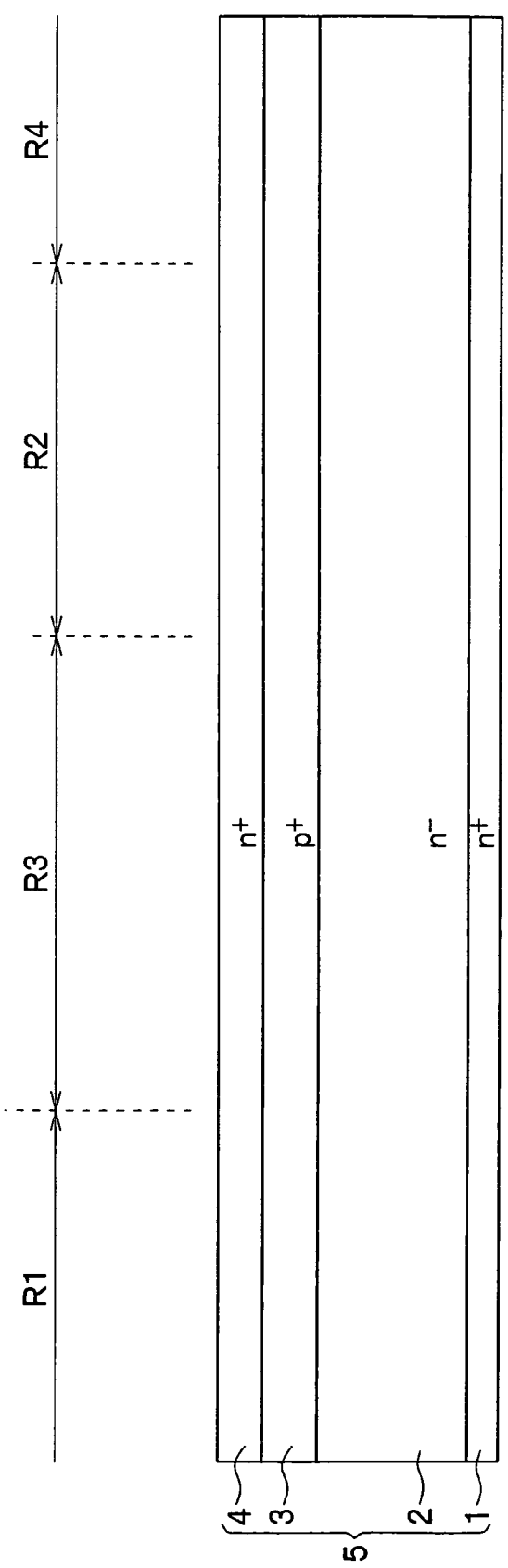
FIG. 7 to FIG. 13 are diagrams illustrating manufacturing processes of the SiC semiconductor device according to the first embodiment.

During a process illustrated in FIG. 7, the semiconductor substrate 5 is prepared. The semiconductor substrate 5 includes the N+ type substrate 1 having an impurity concentration greater than or equal to about $1\times10^{19}$ cm$^{-3}$, for example. The semiconductor substrate 5 further includes the N− type drift layer 2, the P+ type layer 3, and the N+ type layer 4 epitaxially formed on the N+ type substrate 1. The N− type drift layer 2 has an impurity concentration of from about $1\times10^{15}$ cm$^{-3}$ to about $5\times10^{16}$ cm$^{-3}$, for example. The P+ type layer 3 has an impurity concentration of from about $1\times10^{18}$ cm$^{-3}$ to about $5\times10^{19}$ cm$^{-3}$, for example. The N+ type layer 4 has an impurity concentration of from about $1\times10^{18}$ cm$^{-3}$ to about $5\times10^{20}$ cm$^{-3}$ for example.

Figure 8:
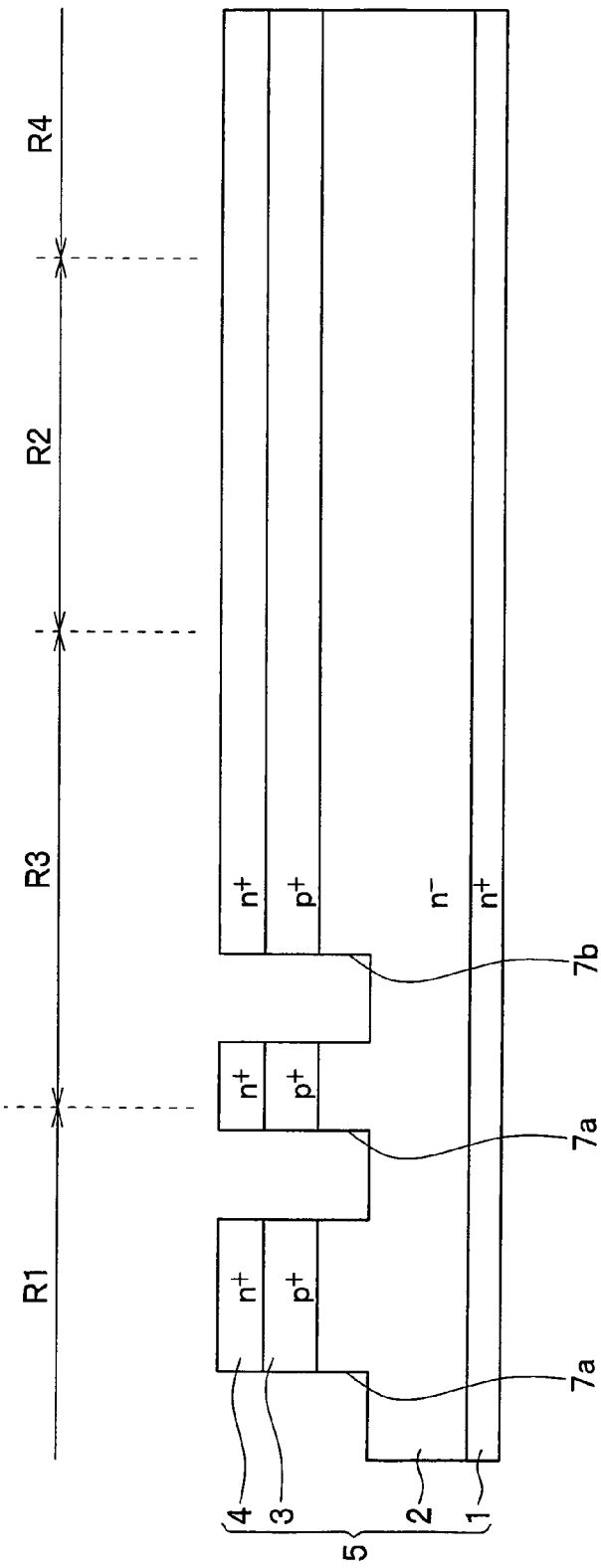

During a process illustrated in FIG. 8, a mask (not shown) is disposed on the front surface of the semiconductor substrate 5. Then, openings are provided at portions of the mask where the trenches 7a in the transistor cell region R1 and the trench 7b in the electric field relaxation region R3 will be formed. The semiconductor substrate 5 is treated by etching with the mask, and thereby the trenches 7a and 7b penetrating the N+ type layer 4 and the P+ type layer 3 to the N− type drift layer 2 are provided at the same time. The trenches 7a divide the P+ type layer 3 and the N+ type layer 4 into a plurality of sections. The P+ type layer 3 and the N+ type layer 4 located on a side surface of the trenches 7a provide the first gate region 3a and the N+ type source region 4a, respectively. After providing the trenches 7a and 7b, the mask is removed.

Figure 9:
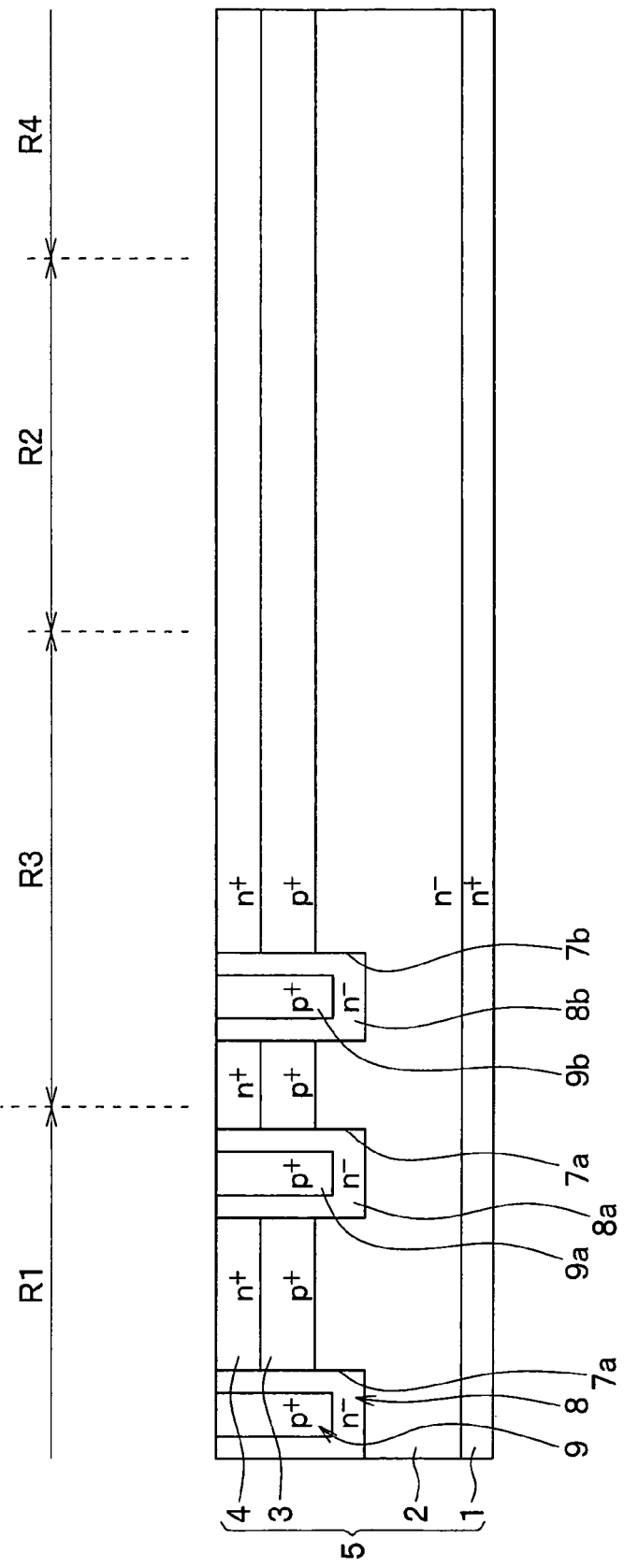

During a process illustrated in FIG. 9, the N− type layer 8 and the P+ type layer are epitaxially formed on the front surface of the semiconductor substrate 5 so as to fill the trenches 7a and 7b. Then, the semiconductor substrate 5 is treated by a planarization process, for example, chemical mechanical polishing (CMP) so that the N− type layer 8 and the P+ type layer 9 remain only in the trenches 7a and 7b. As a result, the N− type channel layer 8a and the second gate region 9a are formed in each of the trenches 7a in the transistor cell region R1. In addition, the PN junction including the N type region 8b and the P type region 9b are formed in the trench 7b in the electric field relaxation region R3.

Figure 10:
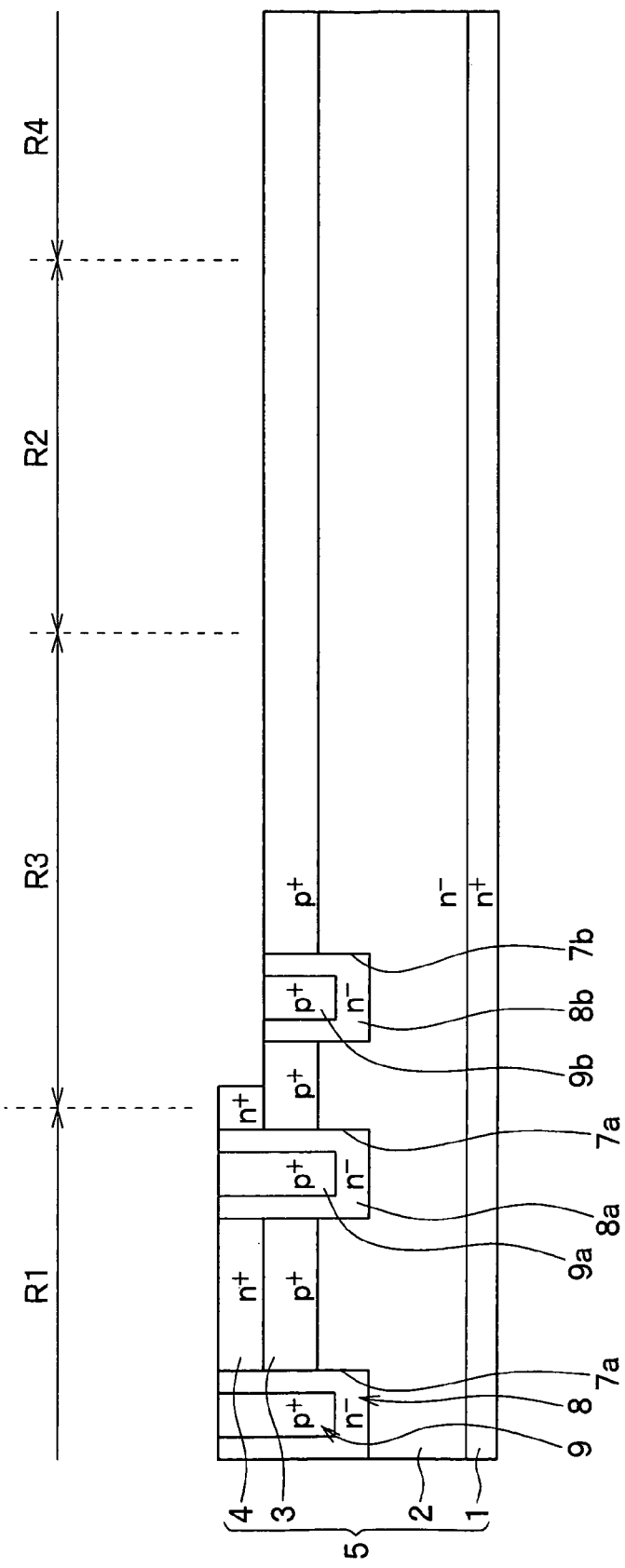

During a process illustrated in FIG. 10, a mask covering the transistor cell region R1 is disposed on the front surface of the semiconductor substrate 5. The semiconductor substrate 5 is treated by etching, and thereby the N+ type layer 4 is removed from the diode forming region R2, the electric field relaxation region R3 and the outer peripheral region R4.

Figure 11:
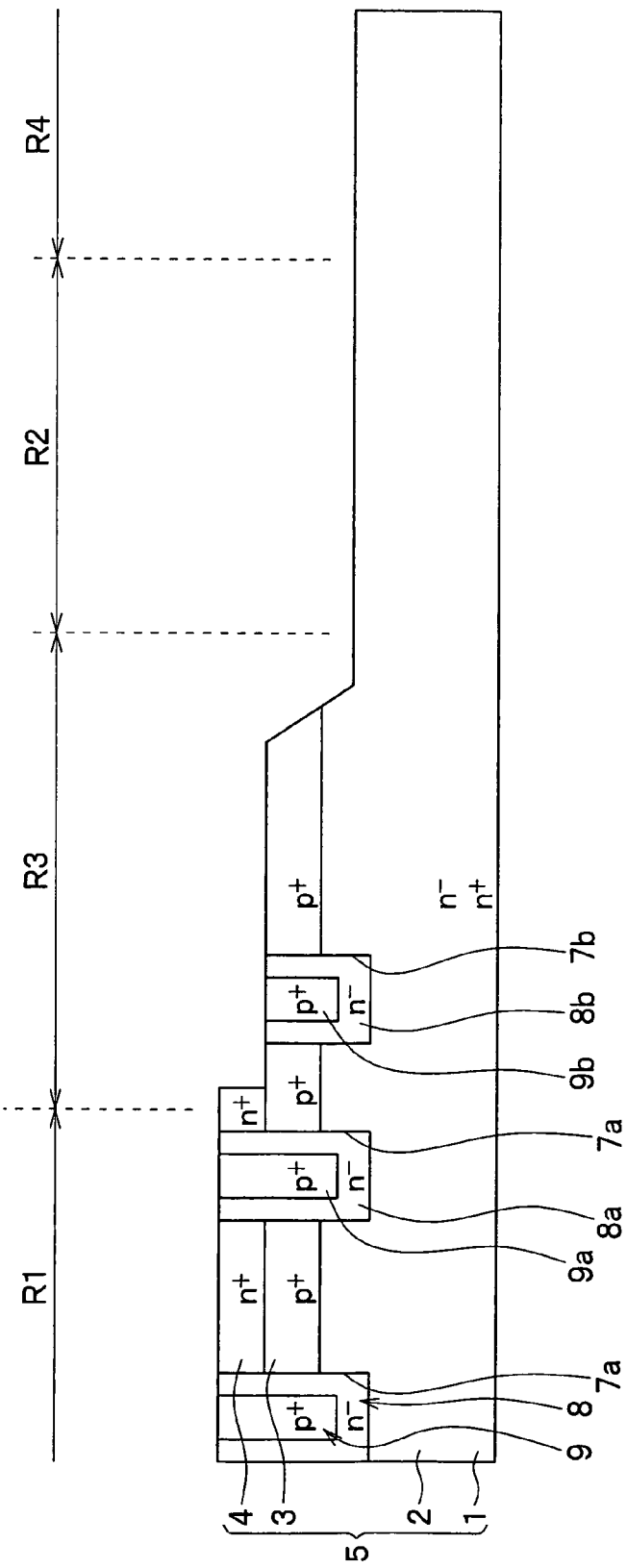

During a process illustrated in FIG. 11, a mask covering the transistor cell region R1 and the electric field relaxation region R3 is disposed on the semiconductor substrate 5. The semiconductor substrate 5 is treated by etching, and thereby the P+ type layer 3 is removed from the diode forming region R2 and the outer peripheral region R4 and the N− type drift layer 2 is exposed. In the above-described process, an isotropic etching or an anisotropic etching using a plane direction dependency may be performed so that the stepped portion at the boundary section between the electric field relaxation region R3 and the diode forming region R2 has a taper shape or a mesa shape.

Figure 12:
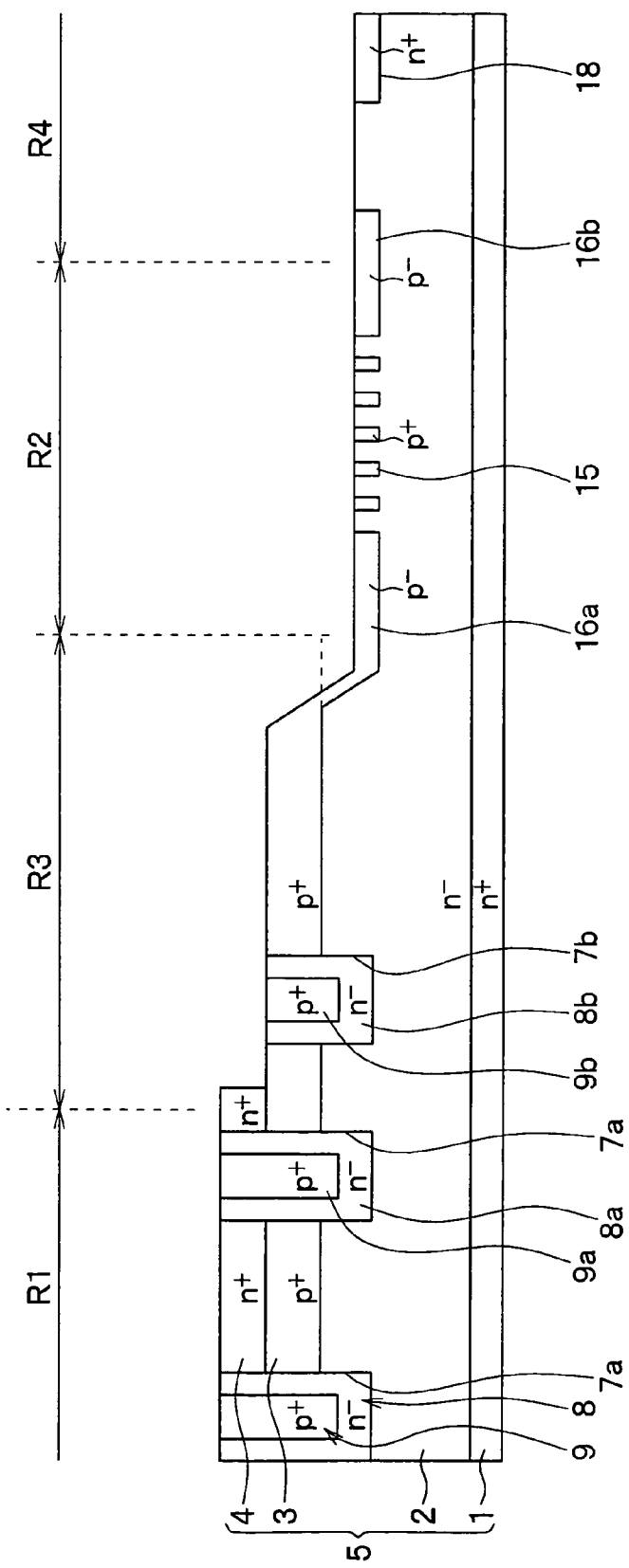

During a process illustrated in FIG. 12, a mask having openings at portions where the P+ type layers 15 will be formed is disposed on the front surface of the semiconductor substrate 5. Then, P type impurities are ion-implanted through the openings. After removing the mask, another mask having openings at portions where the P− type RESURF layers 16a and 16b will be formed is disposed on the front surface of the semiconductor substrate 5. Then, P type impurities are ion-implanted through the openings. When the stepped portion at the boundary section between the electric field relaxation region R3 and the diode forming region R2 has the taper shape as described above, the P type impurities can be ion-implanted to the stepped portion by ion-implanting from a direction perpendicular to the semiconductor substrate 5. Even when the stepped portion is perpendicular to the front surface of the semiconductor substrate 5, the P type impurities can be ion-implanted to the stepped portion by ion-implanting obliquely.

After removing the mask, another mask having an opening at a portion where the N+ type layer 18 will be formed is disposed on the front surface of the semiconductor substrate 5 and N type impurities are ion-implanted. Then, the semiconductor substrate 5 is heat-treated so that the implanted ions are activated and the P− type RESURF layers 16a and 16b, the P+ type layers 15, and the N+ type layer 18 are formed.

Figure 13:
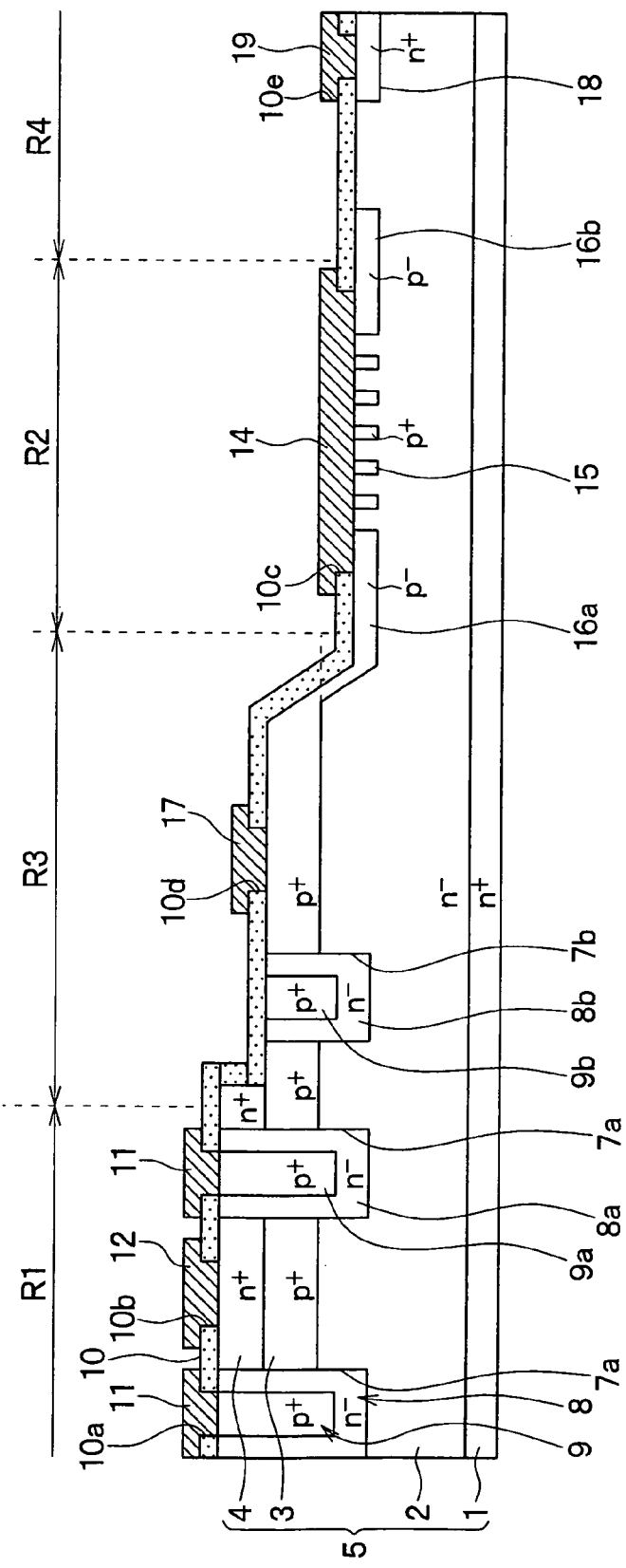

During a process illustrated in FIG. 13, the interlayer insulating layer 10 is disposed on the front surface of the semiconductor substrate 5 and the contact holes 10a, 10b, 10d, 10e, and the window portions 10c are provided by patterning. Then, the gate electrode 11, the source electrode 12, the front-surface electrode 14, the surge drawing electrode 17, and the equipotential ring electrode 19 are formed by patterning metal layers. The metal layers are made of, for example, aluminum that can have an ohmic contact with a P type SiC and nickel that can have an ohmic contact with an N type SiC.

Although subsequent processes are not illustrated, the drain electrode 13 is disposed on the rear surface of the semiconductor substrate 5.

Second Embodiment

Figure 14:
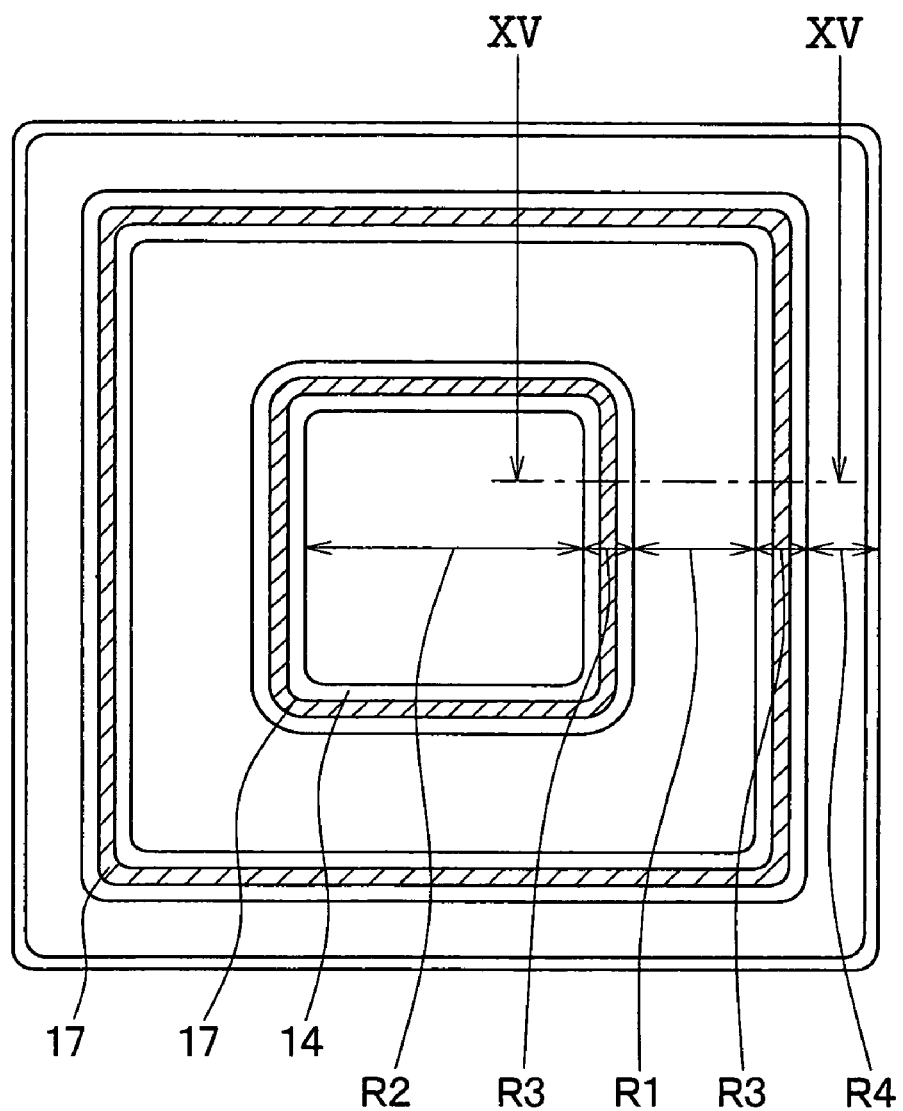
FIG. 14 is a diagram illustrating a top view of an SiC semiconductor device according to a second embodiment of the present invention.
Figure 15:
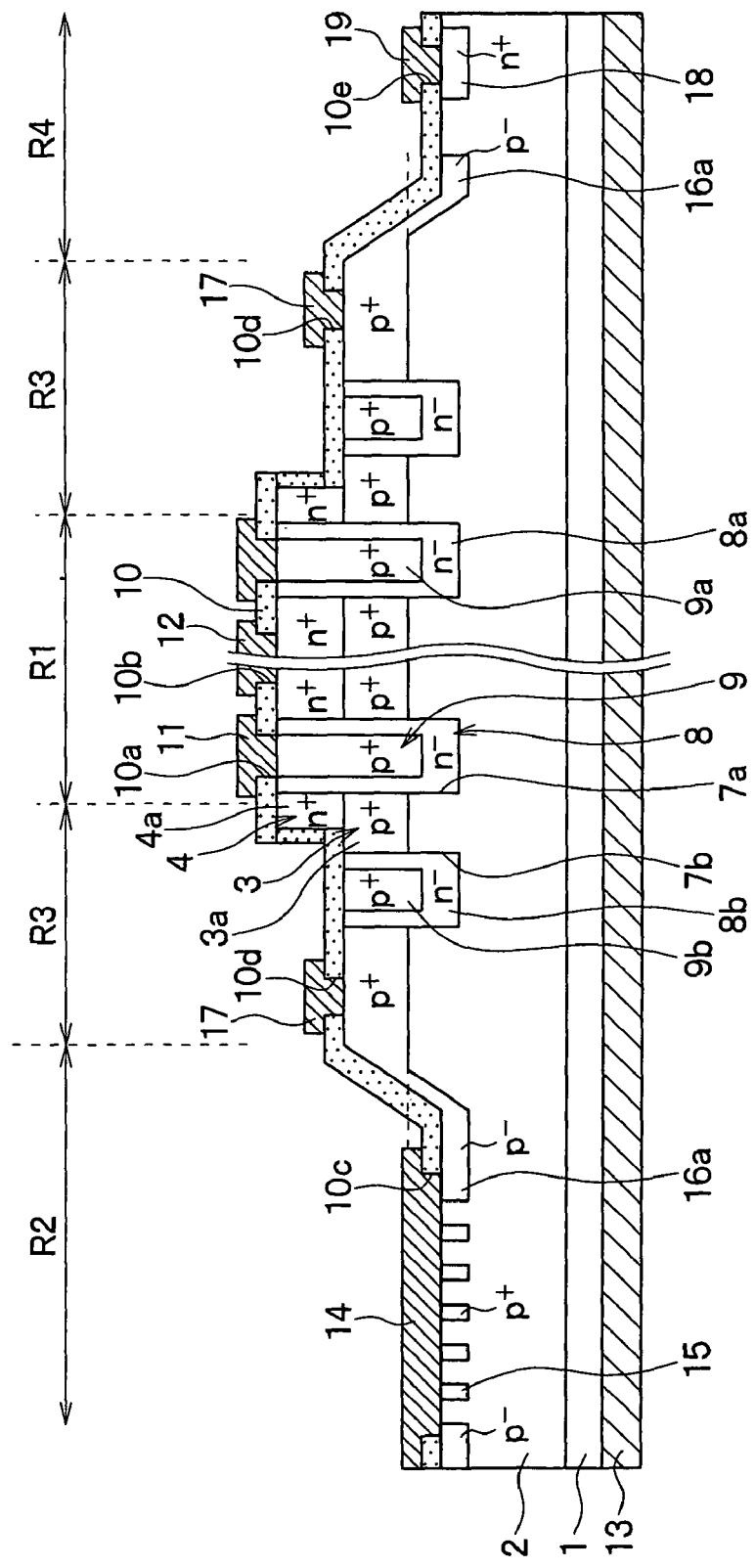
FIG. 15 is a diagram illustrating a cross-sectional view of the SiC semiconductor device taken along line XV-XV in FIG. 14.

An SiC semiconductor device according to a second embodiment of the present invention will be described with reference to FIG. 14 and FIG. 15.

The SiC semiconductor device includes a transistor cell region R1, a diode forming region R2, an electric filed relaxation region R3 and an outer peripheral region R4. Diode forming region R2 is located at a center portion of the semiconductor substrate 5. The transistor cell region R1 surrounds the diode forming region R2. The electric field relaxation region R3 is disposed between the transistor cell region R1 and the diode forming region R2 so as to surround the diode forming region R2. The outer peripheral region R4 surrounds the transistor cell region R1. The electric field relaxation region R3 is further located between the transistor cell region R1 and the outer peripheral region R4 so as to surround the transistor cell region R1. As illustrated in FIG. 15, each of the transistor cell region R1, the diode forming region R2, the electric field relaxation region R3, and the outer peripheral region R4 has a configuration similar to a configuration of a corresponding region in the SiC semiconductor device according to the first embodiment.

Even when the diode forming region R2 is located at the center portion and the transistor cell region R1 surrounds the diode forming region R2 as described above, the SiC semiconductor device can have effects similar to the SiC semiconductor device according to the first embodiment.

Third Embodiment

An SiC semiconductor device according to a third embodiment of the present invention, will be described with reference to FIG. 16. In the SiC semiconductor device according to the present embodiment, each of a diode forming region R2 and an outer peripheral region R4 has a configuration different from a corresponding region in the SiC semiconductor device according to the first embodiment. Other regions in the SiC semiconductor device according to the present embodiment are similar to corresponding regions in the SiC semiconductor device according to the first embodiment. Thus, a part different from the first embodiment will be mainly described.

Figure 16:
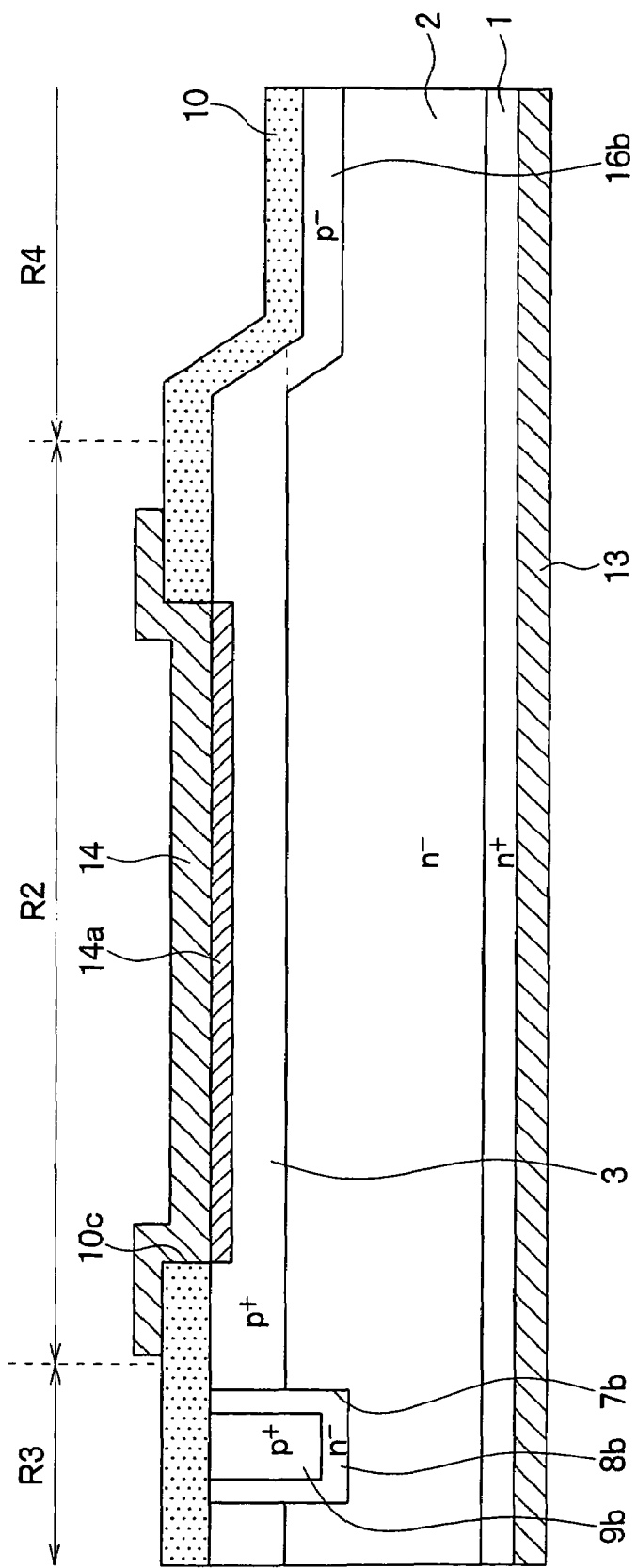
FIG. 16 is a diagram illustrating a part of an SiC semiconductor device according to a third embodiment of the present invention.

A portion in the vicinity of the diode forming region R2 in the SiC semiconductor device according to the present embodiment is illustrated in FIG. 16. As illustrated in FIG. 16, the diode forming region R2 includes a PN diode. For example, the P+ type layer 3 and the N+ type drift layer 2 formed in the semiconductor substrate 5 can be used as a P type region and an N type region for forming a PN junction. When a portion of the front-surface electrode 14 being in contact with the P+ type layer 3 is made of, for example, Ni, a silicide layer 14a is formed at a surface portion of the P+ type layer 3 and the front-surface electrode 14 has an ohmic contact with the P+ type layer 3. The electric field relaxation region R3 and the diode forming region R2 are substantially flat.

In the outer peripheral region R4, the P+ type layer 3 is removed and the N− type drift layer 2 is exposed. A P− type RESURF layer 16b extends outward from a portion located under an end portion of the P+ type layer 3. In such a case, an electric field concentration at the end portion of the P+ type layer 3 can be relaxed, and a breakdown of the interlayer insulating layer 10 at the end portion of the P+ type layer 3 can be restricted.

A manufacturing process of the SiC semiconductor device according to the present embodiment may be similar to the manufacturing process described in the first embodiment. However, processes described below are different from the first embodiment.

First, the processes until the process illustrated in FIG. 10 are performed. During a process illustrated in FIG. 11, a mask having an opening only in the outer peripheral region R4 is disposed on the front surface of the semiconductor substrate 5. Then, the semiconductor substrate 5 is treated by etching, and thereby the P+ type layer 3 is removed from the outer peripheral region R4. During a process illustrated in FIG. 12, P type impurities are ion-implanted so as to form the P− type RESURF layer 16b. When an exposed portion of the N− type drift layer 2 has a mesa shape, the P− type RESURF layer 16b extending outward from the portion under the end portion of the P+ type layer 3 can be formed. Subsequent processes are similar to first embodiment. When the front-surface electrode 14 is formed, the metal layer made of, for example, Ni and having the ohmic contact with the P+ type SiC may be left in the diode forming region R2. Then, a salicide process is performed so that the front-surface electrode 14 having the ohmic contact with the P+ type layer 3 is formed.

Fourth Embodiment

An SiC semiconductor device according to a fourth embodiment of the present invention will be described with reference to FIG. 17. The SiC semiconductor device according to the present embodiment includes a P+ type layer 3 that has a configuration different from the P+ type layer 3 in the SiC semiconductor device according to the third embodiment. Other parts in the SiC semiconductor device according to the present embodiment are similar to corresponding parts in the SiC semiconductor device according to the third embodiment. Thus, a part different from the third embodiment will be mainly described.

Figure 17:
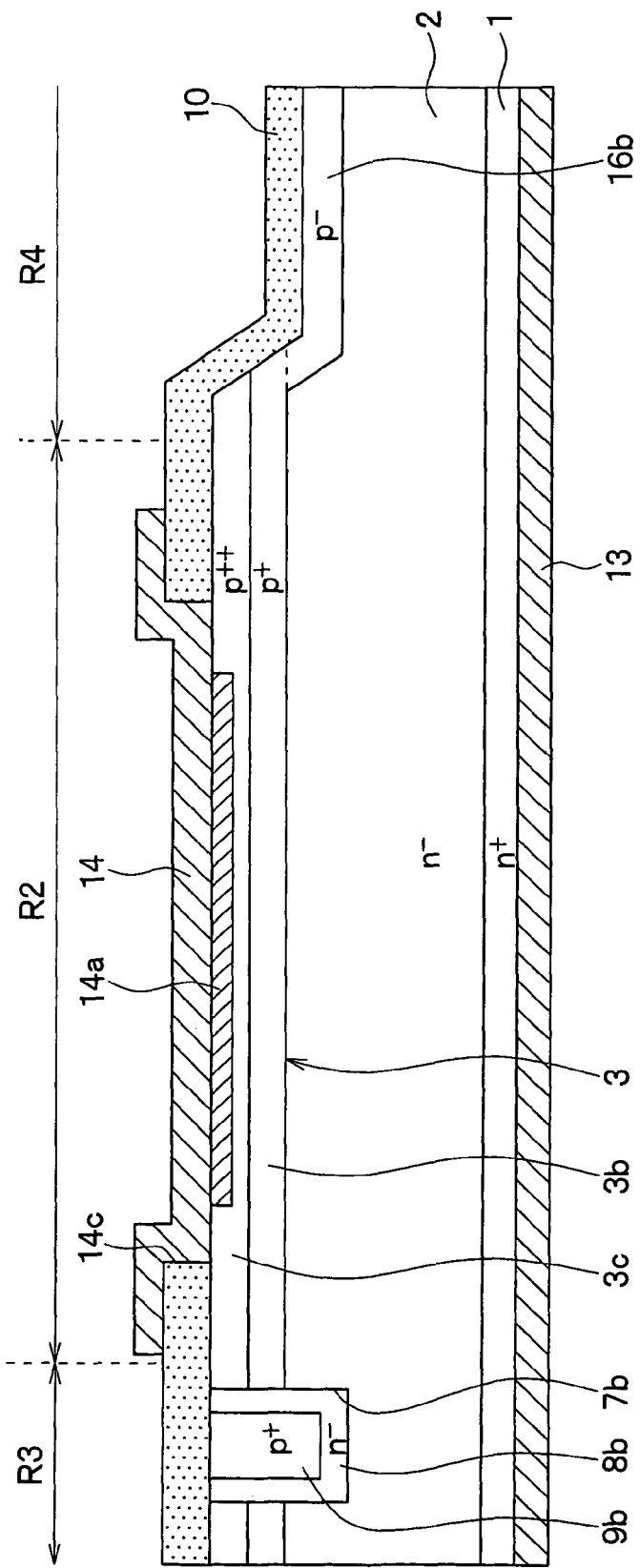
FIG. 17 is a diagram illustrating a part of an SiC semiconductor device according to a fourth embodiment of the present invention.

A portion in the vicinity of the diode forming region R2 in the SiC semiconductor device according to the present embodiment is illustrated in FIG. 17. As illustrated in FIG. 17, the P+ type layer 3 includes an upper section 3c and a lower section 3b. The upper section 3c has an impurity concentration higher than the lower section 3b. By changing the impurity concentration in the P+ type layer 3, a contact resistance between the upper section 3c and the front surface electrode 14 can be reduced. Also in the transistor cell region R1, the upper section 3c has a high impurity concentration. Thus, a contact resistance between the second gate region 9a and a gate electrode (not shown) can be reduced.

The upper section 3c and the lower section 3b can be formed by epitaxially forming the P+ type layer 3 in two steps and changing the doped amount of the P type impurity between the two steps.

Fifth Embodiment

An SiC semiconductor device according to a fifth embodiment of the present invention will be described with reference to FIG. 18. The SiC semiconductor device according to the present invention includes a schottky diode in addition to the PN diode in the diode forming region R2. Other parts in the SiC semiconductor device according to the present embodiment are similar to corresponding parts in the SiC semiconductor device according to the third embodiment. Thus, a part different from the third embodiment will be mainly described.

Figure 18:
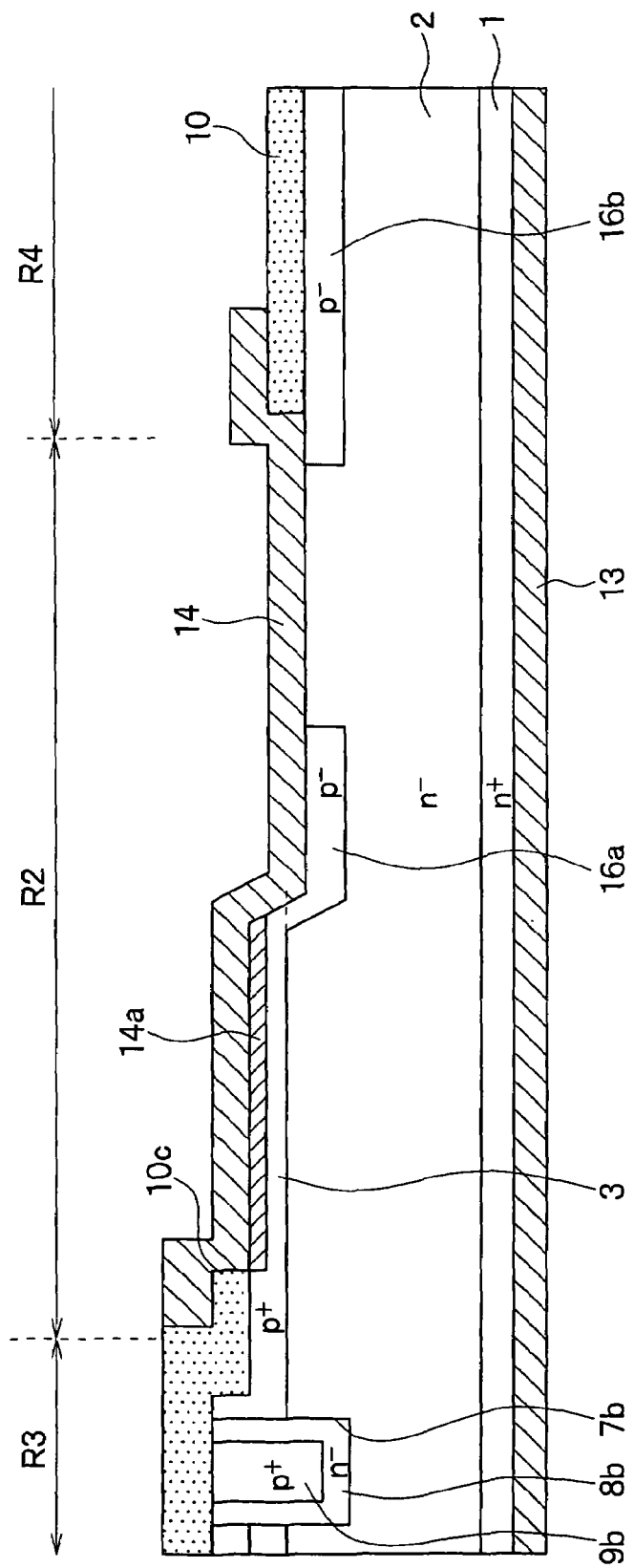
FIG. 18 is a diagram illustrating a part of an SiC semiconductor device according to a fifth embodiment of the present invention.

A portion in the vicinity of the diode forming region R2 in the SiC semiconductor device according to the present embodiment is illustrated in FIG. 18. In the diode forming region R2, the PN diode is disposed at a portion adjacent to the electric field relaxation region R3, and the schottky diode is disposed at a portion adjacent to the outer peripheral region R4. The PN diode is similar to the PN diode in the SiC semiconductor device according to the third embodiment. The front-surface electrode 14 has a schottky contact with the N− type drift layer 2 so as to provide the schottky diode. The front-surface electrode 14 is shared by the PN diode and the schottky diode.

The PN diode and the schottky diode are provided in parallel. The PN diode and the schottky diode respectively have a voltage-current property depending on a temperature. When a temperature is lower than a predetermined temperature about 250 degree centigrade, electric current that flows in the PN diode is greater than electric current that flows in the schottky diode. When the temperature is higher than the predetermined temperature, the electric current that flows in the schottky diode is greater than the electric current that flows in the PN diode. Thus, a great electric current can flow in the SiC semiconductor device regardless of a temperature at which the SiC semiconductor device is used. At a portion between the PN diode and the schottky diode, the P− type RESURF layer 16a is disposed. The P− type RESURF layer 16a extends outward from the portion located under the end portion of the P+ type layer 3. The P− type RESURF layer 16a can be formed by ion-implanting P type impurities into an inclined and exposed portion of the N− type drift layer 2 having a mesa shape. Due to the P− type RESURF layer 16a, an electric field concentration at the end portion of the P+ type layer 3 can be reduced.

Sixth Embodiment

An SiC semiconductor device according to a sixth embodiment of the present invention will be described with reference to FIG. 6. In the SiC semiconductor device according to the present embodiment, each of a diode forming region R2 and an outer peripheral region R4 has a configuration different from a corresponding region in the SiC semiconductor device according to the first embodiment. Other parts in the SiC semiconductor device according to the present embodiment are similar to corresponding parts in the SiC semiconductor device according to the first embodiment. Thus, a part different from the first embodiment will be mainly described.

Figure 19:
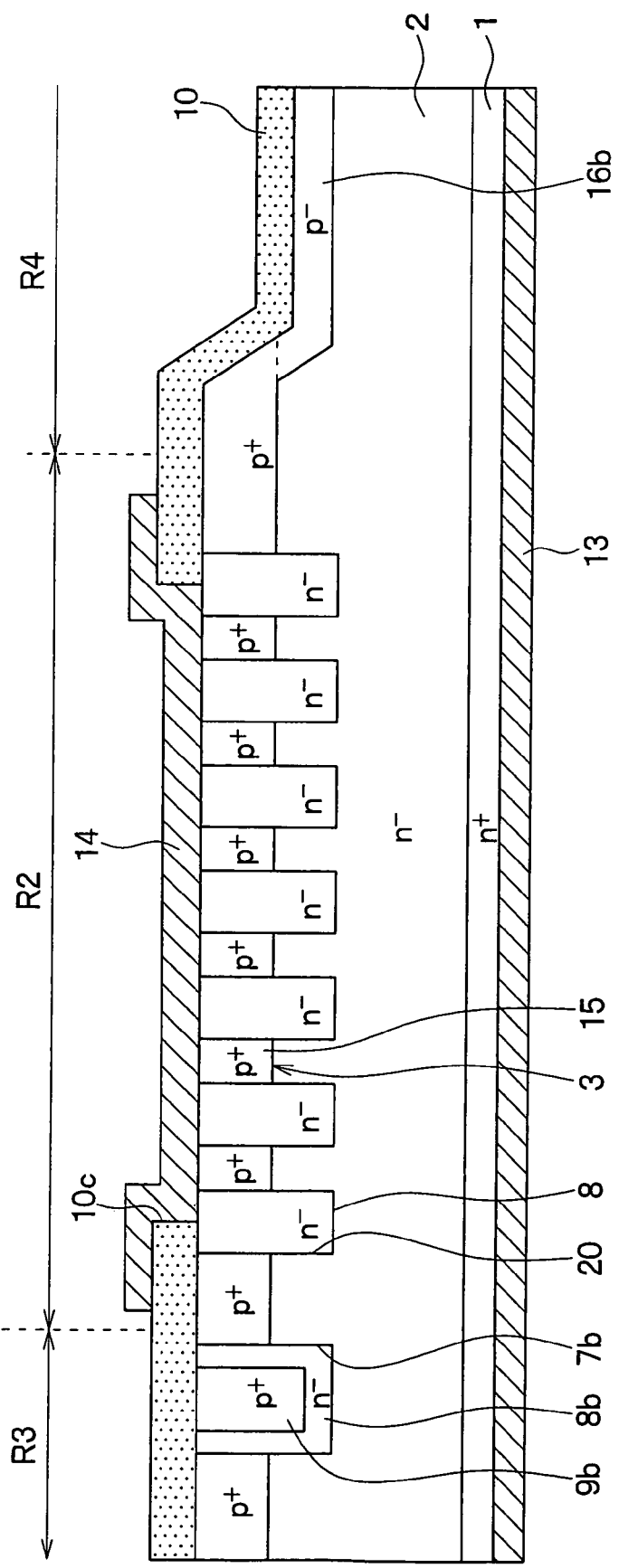
FIG. 19 is a diagram illustrating a part of an SiC semiconductor device according to a sixth embodiment of the present invention.

A portion in the vicinity of the outer peripheral region R4 in the SiC semiconductor device according to the present embodiment is illustrated in FIG. 19. The P+ type layer 3 remains in the diode forming region R2, and a plurality of trenches 20 are provided in the diode forming region R2 so as to divide the P+ type layer 3. Each of the trenches 20 is filled with the N− type layer 8. The divided P+ type layer 3 provides the P+ type layers 15. Also in the present case, the JBS can be formed in the diode-forming region R2.

The P− type RESURF layer 16b in the outer peripheral region R4 has a structure similar to the P− type RESURF layer 16b in the SiC semiconductor device according to the third embodiment. The P− type RESURF layer 16b extends outward from the portion under the end portion of the P+ type layer 3. Thus, an electric field concentration at the end portion of the P+ type layer 3 can be restricted and a breakdown of the interlayer insulating layer 10 can be restricted.

A manufacturing process of the SiC semiconductor device according to the present embodiment may be similar to the manufacturing process described in the first embodiment. However, processes described below are different from the first embodiment.

When a mask is disposed on the front surface of the semiconductor substrate 5 during the process illustrated in FIG. 8, in the diode forming region R2, the mask covers portions where the P+ type layers 15 will be formed and the mask opens at the other portions. Then, the semiconductor substrate 5 is treated by etching with the mask, and thereby the trenches 20 are provided in the diode forming region R2 at the same time when the trenches 7a in the transistor cell region R1 and the trench 7b in the electric field relaxation region R3 are provided. Each of the trenches 20 has a width less than or equal to two times a thickness of the N− type layer 8 formed during the following process.

During a process illustrated in FIG. 9, the N− type layer 8 is formed in the trenches 20a in addition to the trenches 7a and the trench 7b. Since each of the trenches 20 has the width less than or equal to two times the thickness of the N− type layer 8, the trenches 20 are fully filled with the N− type layer 8. Thus, when the trenches 7a and the electric field relaxation region R3 are filled with the P+ type layer 9, the P+ type layer 9 does not enter the trenches 20.

During the processes illustrated in FIG. 11 and FIG. 12, only an ion-implanting process of the P type impurity for forming the P− type RESURF layer 16b is performed. Then, the subsequent processes are performed.

In the above-described manufacturing method, the trenches 20 can be provided at the same time when the trenches 7a in the transistor cell region R1 and the trench 7b in the electric field relaxation region R3 are provided. In addition, by filling the trenches 20 with the N− type layer 8, the P+ type layers 15 can be provided by the divided P+ type layer 3. Thus, the manufacturing processes can be simplified.

Figure 20:
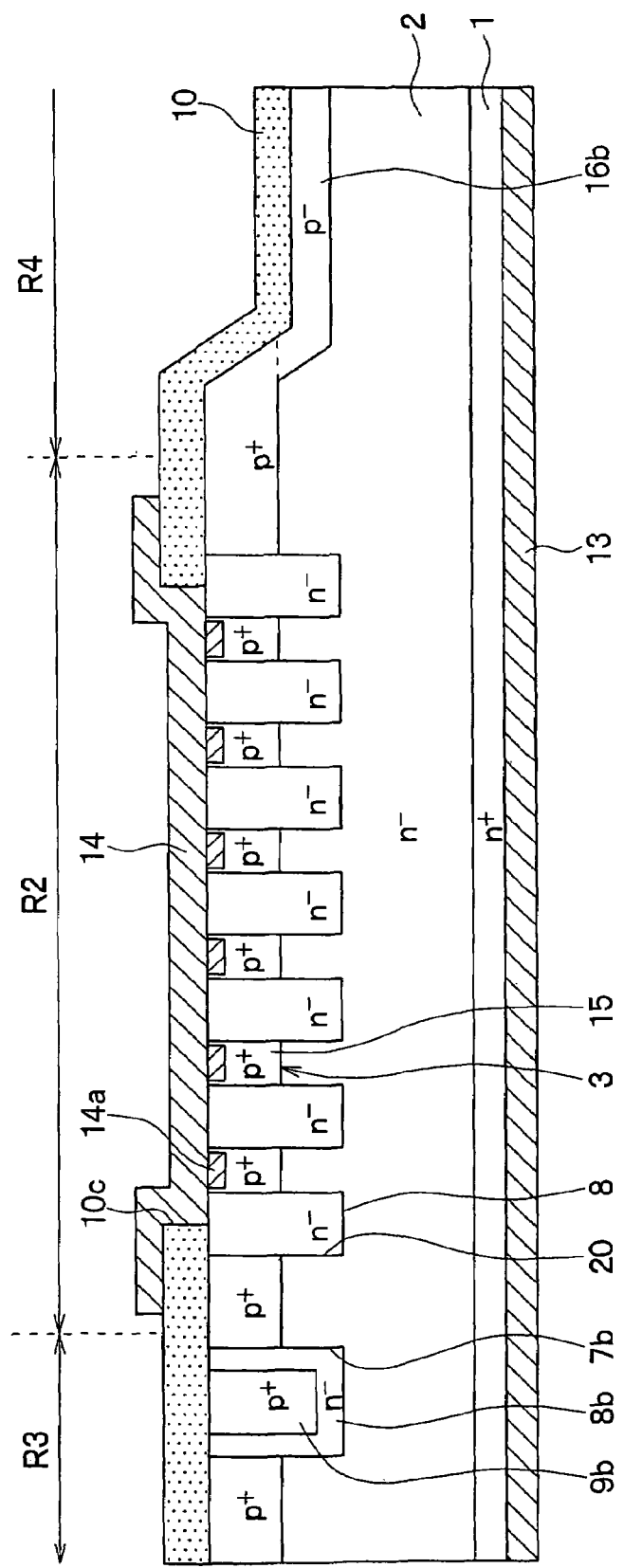
FIG. 20 is a diagram illustrating a part of an SiC semiconductor device according a modification of the sixth embodiment.

In the JBS illustrated in FIG. 19, the front-surface electrode 14 has a schottky contact with the N− type layer 8 and the P+ type layers 15 are in a floating state. In an SiC semiconductor device according to a modification of the present embodiment illustrated in FIG. 20, silicide layers 14a are formed at respective contact portions of the P+ type layers 15 and the front-surface electrode 14. Thus, the P+ type layers 15 can operate as PN diodes.

Seventh Embodiment

An SiC semiconductor device according to a seventh embodiment of the present invention will be described with reference to FIG. 21. In the SiC semiconductor device according to the present embodiment, an outer peripheral region has a configuration different from the outer peripheral region in the SiC semiconductor device according to the third embodiment. Other parts in the SiC semiconductor device according to the present embodiment are similar to corresponding parts in the SiC semiconductor device according to the sixth embodiment. Thus, a part different from the sixth embodiment will be mainly described.

Figure 21:
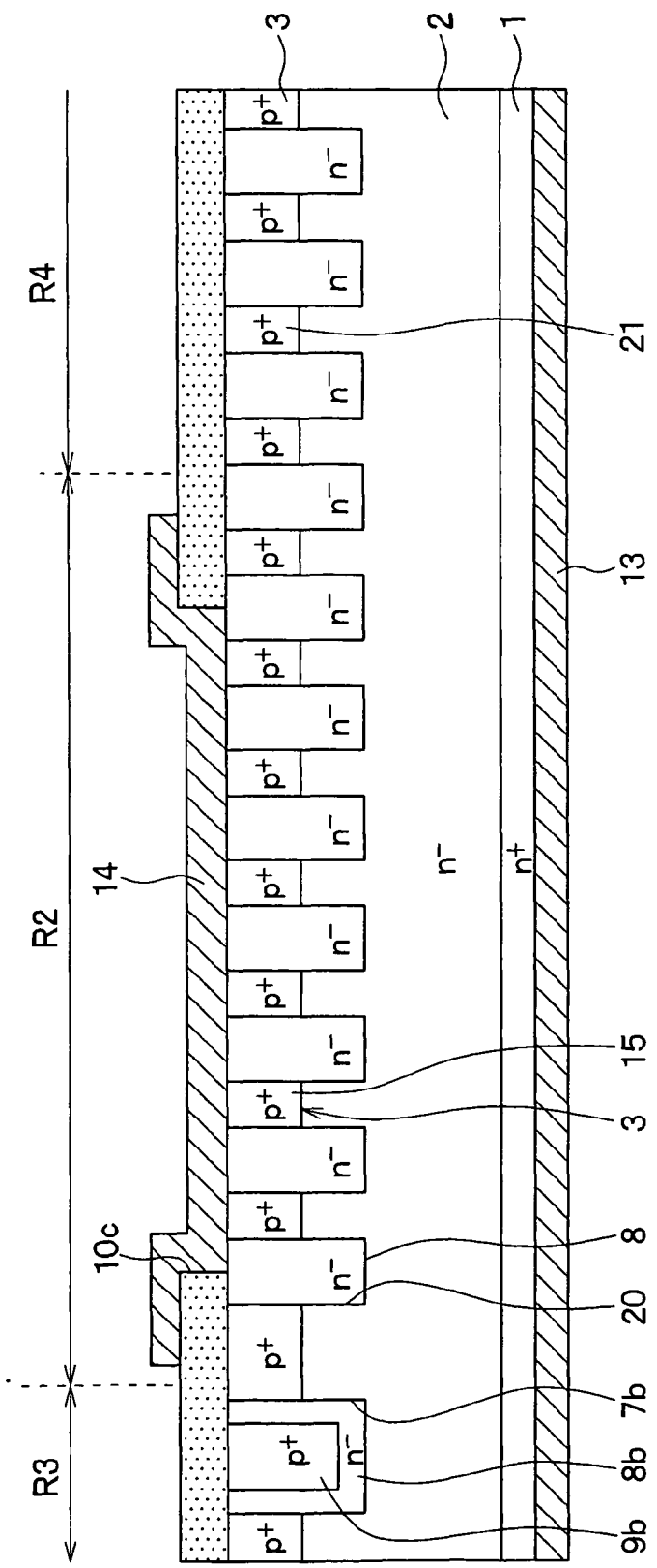
FIG. 21 is a diagram illustrating a part of an SiC semiconductor device according to a seventh embodiment of the present invention.

A portion in the vicinity of the outer peripheral region R4 in the SiC semiconductor device according to the present embodiment is illustrated in FIG. 21. In the present embodiment, the P+ type layer 3 remains in the outer peripheral region R4 in addition to the diode forming region R2. The trenches 20 are provided in the diode forming region R2 and the outer peripheral region R4 so as to divide the P+ type layer 3. The trenches 20 are filled with the N− type layer 8. Thus, the divided P+ type layer 3 provide the P+ type layers 15. In addition, in the outer peripheral region R4, a guard ring including a plurality of P+ type layers 21 arranged at even intervals is formed.

A manufacturing process of the SiC semiconductor device according to the present embodiment may be similar to the manufacturing process described in the sixth embodiment. When a mask is disposed on the front surface of the semiconductor substrate 5 during the process illustrated in FIG. 8, in the diode forming region R2 and the outer peripheral region R4, the mask covers portions where the P+ type layers 15 and the P+ type layers 21 will be formed. Then, the semiconductor substrate 5 is treated by etching, and thereby the trenches 20 are provided in the diode forming region R2 and the outer peripheral region R4.

During the process illustrated in FIG. 9, the N− type layer 8 is formed in the trenches 20 in the diode forming region R2 and the outer peripheral region R4 in addition to the trenches 7a in the transistor cell region R1 and the trench 7b in the electric field relaxation region R4. The trenches 20 are fully filled with the N− type layer 8.

After that, the ion-implanting process for forming the P− type RESURF layers 16a and 16b and the P+ type layers 15 in the processes illustrated in FIG. 11 and FIG. 12 is omitted and the subsequent processes are performed.

In the above-described manufacturing method, the trenches 20 in the diode forming region R2 and the outer peripheral region R4 can be provided at the same time when the trenches 7a and the trench 7b are provided. The trenches 20 are filled with the N− type layer 8. Thus, the divided P+ type layer 3 can provide the P+ type layers 15, and the guard ring including the P+ type layers 21 arranged at even intervals can be formed in the outer peripheral region R4. Therefore, the manufacturing processes can be simplified.

Figure 22:
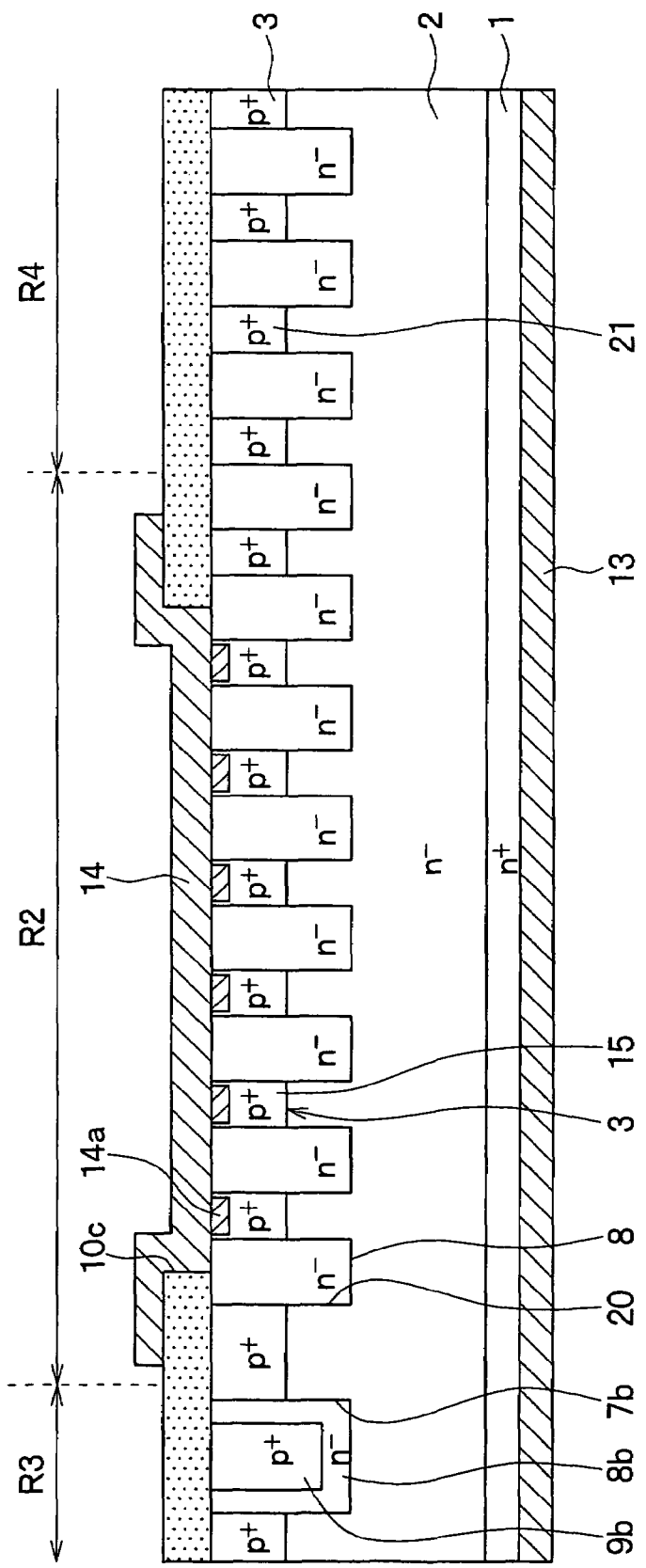
FIG. 22 is a diagram illustrating a part of an SiC semiconductor device according a modification of the seventh embodiment.

In the JBS illustrated in FIG. 21, the front-surface electrode 14 has a schottky contact with the N− type layer 8, and the P+ type layers 15 are in a floating state. In an SiC semiconductor device according to a modification of the present embodiment illustrated in FIG. 22, silicide layers 14a are formed at respective contact portions of the P+ type layers 15 and the front-surface electrode 14. Thus, the P+ type layers 15 can be operated as PN diodes.

Other Embodiments

Although the present invention has been fully described in connection with the exemplary embodiments thereof with reference to the accompanying drawings, it is to be noted that various changes and modifications will become apparent to those skilled in the art.

Figure 23:
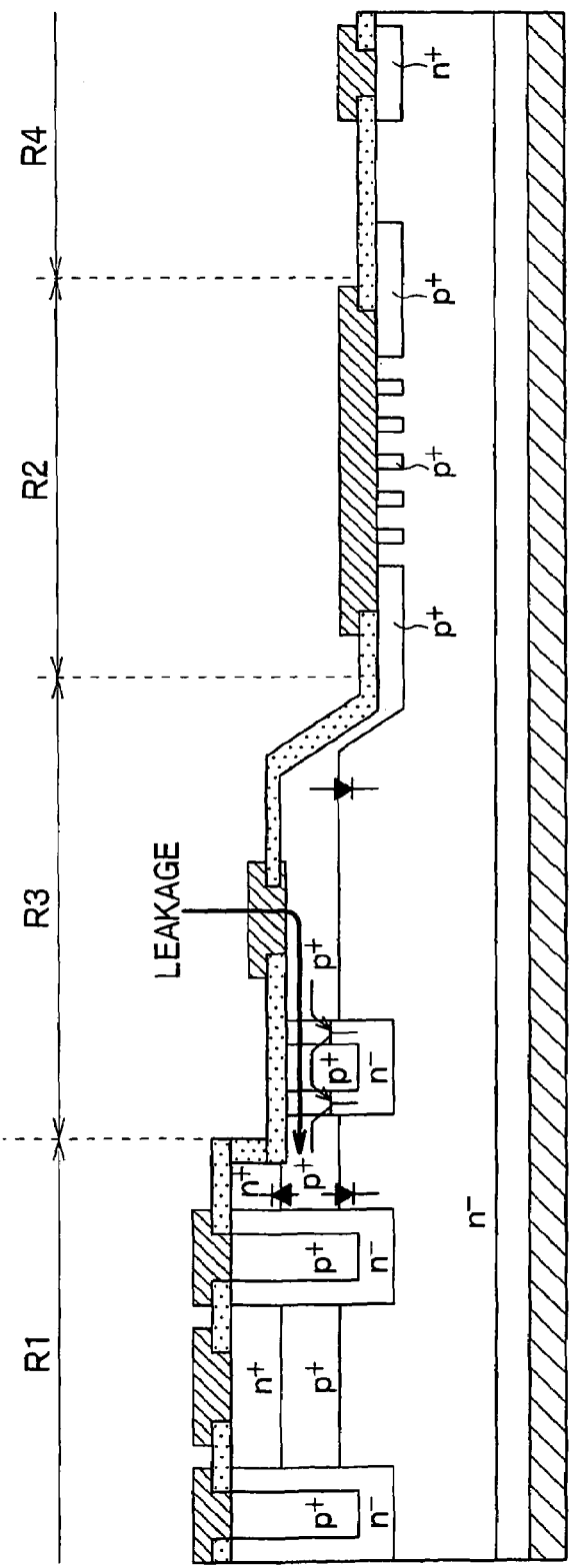
FIG. 23 is a diagram illustrating inherent parasitic elements in the electric field relaxation region R3 of an SiC semiconductor device according to another embodiment of the present invention.

In each of the above-described embodiments, the SiC semiconductor device is configured so that the JFETs are operated in the normally-off mode. Alternatively, the JFETs may be operated in a normally-on mode. When the JFETs are operated in the normally-on mode, a plurality of PN junctions provided by the second gate region 9a in each of the JFETs and the PN junction in the electric field relaxation region R3 are arranged alternately. Thus, when the JFETs in the SiC semiconductor device according to the first embodiment are operated in the normally-on mode, a SiC semiconductor device is similar to a plurality of parasitic transistors coupled in series, as illustrated in FIG. 23. Thus, for example, when a negative voltage is applied to the first gate region 3a, the parasitic transistor may be activated and leakage may generate.

Figure 24:
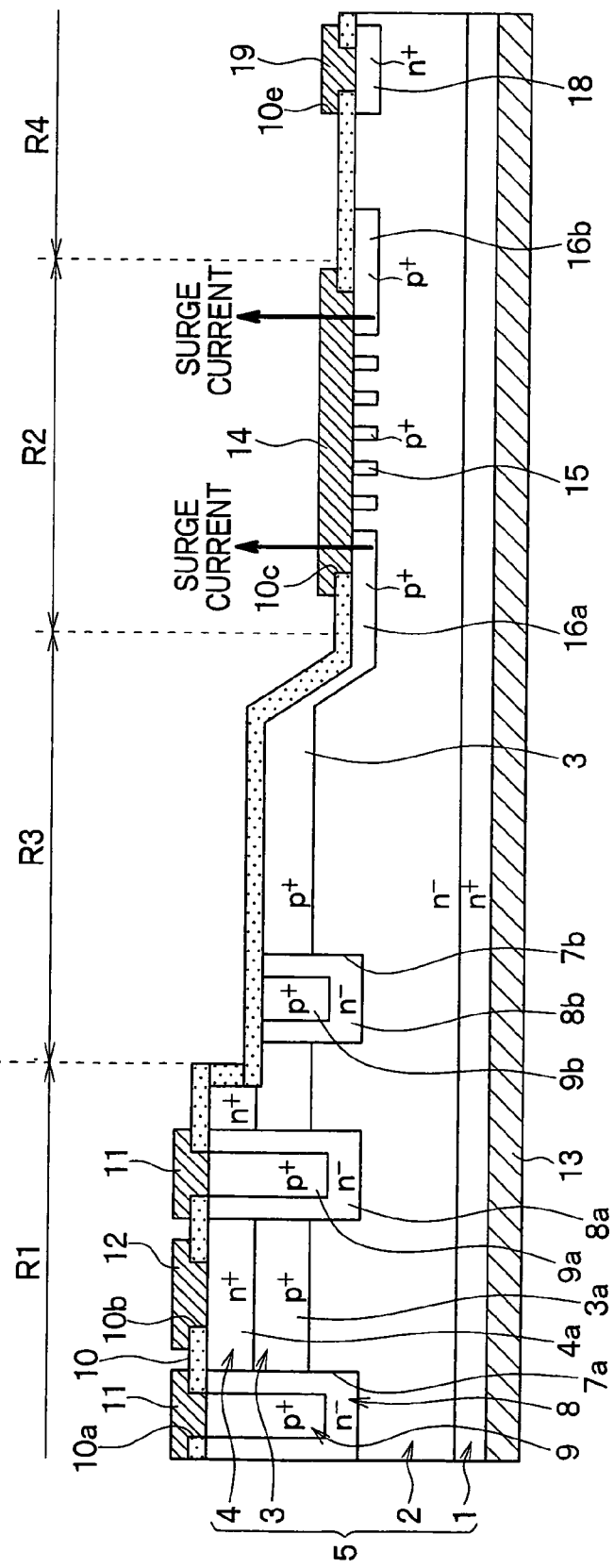
FIG. 24 is a diagram illustrating a cross-sectional view of an SiC semiconductor device according to another embodiment of the present invention.

Thus, when the JFETs are operated in the normally-on mode, the surge drawing electrode 17 may be omitted as illustrated in FIG. 24. Also when the number of the PN junctions in the electric field relaxation region R3 is increased i.e., the effective base width of the inherent parasitic pnp transistors, the parasitic transistors can be restricted from being activated. However, a dimension of the SiC semiconductor device may be increased by the dimension of the PN junction. Thus, omitting the surge drawing electrode 17 is more effective. Even in a case where the JFETs are operated in the normally-off mode, the surge drawing electrode 17 can be omitted.

In each of the above-described embodiments, the first gate region 3a and the second gate region 9a have the same electrical potential. Alternatively, the first gate region 3a may have a first electrical potential, the second gate region 9a may have a second electric potential, and the first electrical potential may be different from the second electric potential. In such a case, the first electrical potential and the second electrical potential may be changed individually or only the first electrical potential may be changed and the second electrical potential may be fixed to a ground potential, that is, a source potential.

In the above-described first and second embodiments, the equipotential ring electrode 19 is disposed in the outer peripheral region R4. Alternatively, a guard ring as described in the seventh embodiment may be disposed in the outer peripheral region R4 in the SiC semiconductor devices according to the first embodiment and the second embodiment. That is, a withstand-voltage part disposed in the outer peripheral region R4 can have various structures.

In each of the above-described embodiments, the impurity concentration of the P+ type layer 9 formed in the trenches 7a in the transistor cell region R1 and the trench 7b in the electric field relaxation region R3 is uniform. The P+ type layer 9 may also have two-layer structure. That is, the P+ type layer 9 may include an inner section and an outer section and an impurity concentration of the inner section may be higher than the outer section. In such a case, a contact resistance between the second gate region 9a and the gate electrode 11 can be reduced and the second gate region 9a and the P type region 9b in the electric, field relaxation region R3 can have a concentration gradient. Thus, the electric field can be relaxed more effectively.

In each of the above-described embodiments, the PN junctions provided by the N type region 8b and the P type region 9b is formed in the trench 7b in the electric field relaxation region R3. Because the trench 7b is surrounded by the P+ type layer 3, even if the trench 7b is filled with only the N type region 8b, the transistor cell region R1 and the diode forming region R2 can be isolated by a PN junction provided by the P+ type layer 3 and the N type region 8b. When the trench 7b is fully filled with the N type region 8b, a width of the trench 7b is set be less than or equal to two times a thickness of the N type region 8b in a manner similar to the trenches 20.

In each of the above-described embodiments, a first conductivity type is the N type and a second conductivity type is the P type. Alternatively, the first conductivity type may be the P type and the second conductivity type may be the N type.

In each of the third to seventh embodiments, the configuration of the SiC semiconductor device according to the first embodiment is modified. It should be noted that the SiC semiconductor device according to the second embodiment may also be modified in a manner similar to the third to seventh embodiments.

In each of the above-described embodiments, SiC is taken as an example of a wide band gap semiconductor. Each of the above-described embodiments may also be applied to a semiconductor device made of other wide band gap semiconductor, for example, GaN and diamond.

What is claimed is:
1. A wide band gap semiconductor device comprising:
a semiconductor substrate having a transistor cell region, a diode forming region, an electric field relaxation region located between the transistor cell region and the diode forming region, and an outer peripheral region surrounding the transistor cell region, diode forming region, and the electric field relaxation region, the semiconductor substrate in the transistor cell region including a substrate, a first semiconductor layer disposed on the substrate, a second semiconductor layer disposed on the first semiconductor layer, and a third semiconductor layer disposed on the second semiconductor layer, the substrate made of a wide band gap semiconductor of a first conductivity type, the first semiconductor layer made of a wide band gap semiconductor of the first conductivity type and having an impurity concentration lower than an impurity concentration of the substrate, the second semiconductor layer made of a wide band gap semiconductor of a second conductivity type, the third semiconductor layer made of a wide band gap semiconductor of the first conductivity type and having an impurity concentration higher than the impurity concentration of the first semiconductor layer, the semiconductor substrate in the electric field relaxation region including the substrate, the first semiconductor layer disposed on the substrate, and the second semiconductor layer disposed on the first semiconductor layer;
a junction field effect transistor (JFET) disposed in the transistor cell region, the JFET including a first trench penetrating the third semiconductor layer and the second semiconductor layer to the first semiconductor layer, a first gate region provided by the second semiconductor layer located on a side surface of the first trench, a source region provided by the third semiconductor layer located on the side surface of the first trench, a channel layer disposed on an inner wall of the first trench and made of a wide band gap semiconductor of the first conductivity type, a second gate region disposed on a surface of the channel layer so as to fill the first trench and made of a wide band gap semiconductor of the second conductivity type, a source electrode electrically coupled with the source region, and a drain electrode electrically coupled with the substrate;
a diode disposed in the diode forming region and including a first-surface electrode and a second-surface electrode, the second-surface electrode provided by the drain electrode and operating as an anode, the first-surface elec- trode disposed on an opposite side of the semiconductor substrate from the second-surface electrode and operating as a cathode;

an outer peripheral withstand-voltage part disposed in the outer peripheral region; and an isolating part disposed in the electric field relaxation region, the isolating part including a second trench penetrating the second semiconductor layer to the first semiconductor layer so as to divide the transistor cell region and the diode forming region, a first conductivity-type layer disposed on an inner wall of the second trench and made of a wide band gap semiconductor of the first conductivity type, and a second conductivity-type layer disposed on a surface of the first conductivity-type layer so as to fill the second trench and made of a wide gap semiconductor of the second conductivity type, the first conductivity-type layer and the second conductivity-type layer providing a PN junction.

2. The wide band gap semiconductor device according to claim 1, further comprising:

a RESURF layer of the second conductivity type; and a surge drawing electrode, wherein:

the semiconductor substrate in the diode forming region including the substrate and the first semiconductor layer disposed on the substrate;

the electric field relaxation region and the diode forming region have a boundary section therebetween and the boundary section has a stepped shape;

the RESURF layer is disposed at a surface portion of the first semiconductor layer at the boundary section and the RESURF layer extends from an end portion the second semiconductor layer toward the diode; and the surge drawing electrode is electrically coupled with a part of the second semiconductor layer in the electric field relaxation region located between the second trench and the diode.

3. The wide band gap semiconductor device according to claim 1, wherein the isolating part includes a plurality of the second trenches.

4. The wide band gap semiconductor device according to claim 1, wherein:

the transistor cell region is located at a center portion of the semiconductor substrate;

the diode forming region surrounds the transistor cell region; and the electric field relaxation region is located between the transistor cell region and the diode forming region so as to surround the transistor cell region.

5. The wide band gap semiconductor device according to claim 1, wherein:

the diode forming region is located at a center portion of the semiconductor substrate;

the transistor cell region surrounds the diode forming region;

the outer peripheral region surrounds the transistor cell region;

the electric field relaxation region is located between the diode forming region and the transistor cell region so as to surround the diode forming region; and the electric field relaxation region is further located between the transistor cell region and the outer peripheral region so as to surround the transistor cell region.

6. The wide band gape semiconductor device according to claim 1, wherein:

the semiconductor substrate in the diode forming region includes the substrate, the first semiconductor layer disposed on the substrate, and the second semiconductor layer disposed on the first semiconductor layer;

the first-surface electrode has an ohmic contact with the second semiconductor layer so as to provide a PN diode having a PN junction of the second semiconductor layer and the first semiconductor layer; and the diode includes the PN diode.

7. The wide band gap semiconductor device according to claim 1, wherein:

the diode forming region has an inner section and an outer section;

the semiconductor substrate in the inner section includes the substrate, the first semiconductor layer disposed on the substrate, and the second semiconductor layer disposed on the first semiconductor layer;

the semiconductor substrate in the outer section includes the substrate and the first semiconductor layer disposed on the substrate;

the first-surface electrode has an ohmic contact with the second semiconductor layer in the inner section so as to provide a PN diode having a PN junction of the second semiconductor layer and the first semiconductor layer;

the first-surface electrode has a schottky contact with the first semiconductor layer in the outer section so as to provide a schottky diode; and the diode includes the PN diode and the schottky diode.

8. The wide band gap semiconductor device according to claim 7, further comprising a RESURF layer of the second conductivity type, the RESURF layer disposed at a surface portion of the first semiconductor layer between the PN diode and the schottky diode, the RESURF layer extending outward from a portion under an end portion of the second semiconductor layer.

9. The wide band gap semiconductor device according to claim 1, wherein:

the semiconductor substrate in the diode forming region includes the substrate, the first semiconductor layer disposed on the substrate, and the second semiconductor layer disposed on the first semiconductor layer;

the diode includes a junction barrier schottky diode; and the junction barrier schottky diode includes a plurality of third trenches penetrating the second semiconductor layer to the first semiconductor layer and filled with the first conductivity-type layer and the second semiconductor layer divided by the plurality of third trenches.

10. The wide band gap semiconductor device according to claim 9, wherein:

the semiconductor substrate in the outer peripheral region includes the substrate, the first semiconductor layer disposed on the substrate, and the second semiconductor layer disposed on the first semiconductor layer;

the outer peripheral withstand-voltage part includes a guard ring; and the guard ring includes a plurality of third trenches penetrating the second semiconductor layer to the first semiconductor layer and filled with the first conductivity-type layer and the second semiconductor layer divided by the plurality of third trenches.

11. The wide band gap semiconductor device according to claim 1, wherein:

the second semiconductor layer includes a first section and a second section;

the first section is disposed on the first semiconductor layer and the second section is disposed on an opposite side of the first section from the first semiconductor layer; and the second section has an impurity concentration higher than an impurity concentration of the first section.

12. The wide band gap semiconductor device according to claim 1, wherein:
the JFET has a first area;
the diode has a second area; and
the first area and the second area are determined in such a manner that an electric current that flows between the source electrode and the drain electrode when the JFET is activated and an electric current that flows between the first-surface electrode and the second-surface electrode of the diode when the JFET is deactivated are substantially equal to each other.

13. A wide band gap semiconductor device comprising:
a semiconductor substrate having a transistor cell region, a diode forming region, an electric field relaxation region located between the transistor cell region and the diode forming region, and an outer peripheral region surrounding the transistor cell region, diode forming region, and the electric field relaxation region, the semiconductor substrate in the transistor cell region including a substrate, a first semiconductor layer disposed on the substrate, a second semiconductor layer disposed on the first semiconductor layer, and a third semiconductor layer disposed on the second semiconductor layer, the substrate made of a wide band gap semiconductor of a first conductivity type, the first semiconductor layer made of a wide band gap semiconductor of the first conductivity type and having an impurity concentration lower than an impurity concentration of the substrate, the second semiconductor layer made of a wide band gap semiconductor of a second conductivity type, the third semiconductor layer made of a wide band gap semiconductor of the first conductivity type and having an impurity concentration higher than the impurity concentration of the first semiconductor layer, the semiconductor substrate in the electric field relaxation region including the substrate, the first semiconductor layer disposed on the substrate, and the second semiconductor layer disposed on the first semiconductor layer;
a junction field effect transistor (JFET) disposed in the transistor cell region, the JFET including a first trench penetrating the third semiconductor layer and the second semiconductor layer to the first semiconductor layer, a first gate region provided by the second semiconductor layer located on a side surface of the first trench, a source region provided by the third semiconductor layer located on the side surface of the first trench, a channel layer disposed on an inner wall of the first trench and made of a wide band gap semiconductor of the first conductivity type, a second gate region disposed on a surface of the channel layer so as to fill the first trench and made of a wide band gap semiconductor of the second conductivity type, a source electrode electrically coupled with the source region, and a drain electrode electrically coupled with the substrate;
a diode disposed in the diode forming region and including a first-surface electrode and a second-surface electrode, the second-surface electrode provided by the drain electrode and operating as an anode, the first-surface electrode disposed on an opposite side of the semiconductor substrate from the second-surface electrode and operating as a cathode;
an outer peripheral withstand-voltage part disposed in the outer peripheral region; and
an isolating part disposed in the electric field relaxation region, the isolating part including a second trench penetrating the second semiconductor layer to the first semiconductor layer so as to divide the transistor cell region and the diode forming region and a first conductivity-type layer filling the second trench and made of a wide band gap semiconductor of the first conductivity type, the first conductivity-type layer and the second semiconductor layer located on a side surface of the second trench providing a PN junction.

\* \* \* \* \*